United States Patent
Vlasenko et al.

(10) Patent No.: US 10,199,933 B2
(45) Date of Patent: Feb. 5, 2019

(54) CIRCUIT FOR CLAMPING CURRENT IN A CHARGE PUMP

(71) Applicant: Conversant Intellectual Property Management Inc., Ottawa (CA)

(72) Inventors: Peter Vlasenko, Ottawa (CA); Huy Tuong Mai, Kanata (CA)

(73) Assignee: Conversant Intellectual Property Management Inc., Ottawa (CA)

( * ) Notice: Subject to any disclaimer, the term of this patent is extended or adjusted under 35 U.S.C. 154(b) by 0 days.

(21) Appl. No.: 15/892,587

(22) Filed: Feb. 9, 2018

(65) Prior Publication Data

US 2018/0331620 A1    Nov. 15, 2018

Related U.S. Application Data

(63) Continuation of application No. 15/674,026, filed on Aug. 10, 2017, now Pat. No. 9,917,511, which is a continuation of application No. 15/174,050, filed on Jun. 6, 2016, now Pat. No. 9,762,120, which is a continuation of application No. 14/513,006, filed on Oct. 13, 2014, now Pat. No. 9,360,878, which is a continuation of application No. 13/873,503, filed on Apr. 30, 2013, now Pat. No. 8,860,480, which is a continuation of application No. 13/405,645, filed on Feb. 27, 2012, now Pat. No. 8,456,208, which is a continuation of application No. 13/032,175, filed on Feb. 22, 2011, now Pat. No. 8,149,032, which is a
(Continued)

(51) Int. Cl.
| | |
|---|---|
| *H03L 7/089* | (2006.01) |
| *H02M 3/07* | (2006.01) |
| *G05F 1/625* | (2006.01) |
| *G05F 3/02* | (2006.01) |
| *H03K 5/08* | (2006.01) |
| *H02M 1/34* | (2007.01) |

(52) U.S. Cl.
CPC .............. *H02M 3/07* (2013.01); *G05F 1/625* (2013.01); *G05F 3/02* (2013.01); *H02M 1/34* (2013.01); *H02M 3/073* (2013.01); *H03K 5/086* (2013.01); *H03L 7/0895* (2013.01)

(58) Field of Classification Search
CPC ......... G11C 16/30; G11C 5/145; G11C 5/147; G11C 5/14; G11C 11/4074; G11C 16/10; G11C 8/08; G11C 16/12; H02M 3/07; H02M 3/073; G05F 3/02
USPC ...................... 327/157, 536, 537; 363/59, 60
See application file for complete search history.

(56) References Cited

U.S. PATENT DOCUMENTS

| | | | |
|---|---|---|---|
| 6,586,976 B2 * | 7/2003 | Yang | H03L 7/0895 327/157 |
| 6,844,762 B2 * | 1/2005 | Sanchez | H03K 4/023 327/157 |
| 2004/0004500 A1 * | 1/2004 | Byun | H03L 7/0895 327/156 |

* cited by examiner

*Primary Examiner* — Lincoln D Donovan
*Assistant Examiner* — Diana J. Cheng
(74) *Attorney, Agent, or Firm* — Conversant IP Management Corp

(57) ABSTRACT

A circuit for clamping current in a charge pump is disclosed. The charge pump includes switching circuitry having a number of switching circuitry transistors. Each of first and second pairs of transistors in the circuit can provide an additional path for current from its associated one of the switching circuitry transistors during off-switching of that transistor so that a spike in current from the switching circuitry transistor is only partially transmitted through a path extending between the switching circuitry transistor and a capacitor of the charge pump.

9 Claims, 16 Drawing Sheets

Related U.S. Application Data continuation of application No. 11/606,827, filed on Nov. 30, 2006, now Pat. No. 7,915,933.

CIRCUIT FOR CLAMPING CURRENT IN A CHARGE PUMP

CROSS-REFERENCE TO RELATED APPLICATIONS

This application is a continuation of U.S. application Ser. No. 15/674,026 filed Aug. 10, 2017, which is a continuation of U.S. application Ser. No. 15/174,050 filed Jun. 6, 2016. now U.S. Pat. No. 9,762,120, which is a continuation of U.S. application Ser. No. 14/513,006 filed Oct. 13, 2014, now U.S. Pat. No. 9,360,878, which is a continuation of U.S. application Ser. No. 13/873,503 filed Apr. 30, 2013, now U.S. Pat. No. 8,860,480, which is a continuation of U.S. application Ser. No. 13/405,645, filed Feb. 27, 2012, now U.S. Pat. No. 8,456,208, which is a continuation of U.S. application Ser. No. 13/032,175, filed Feb. 22, 2011, now U.S. Pat. No. 8,149,032, which is a continuation of U.S. application Ser. No. 11/606,827, filed Nov. 30, 2006, now U.S. Pat. No. 7,915,933.

BACKGROUND

The entire teachings of the above applications are incorporated herein by reference.

As will be appreciated by those skilled in the art, a charge pump can be characterized as a circuit that uses capacitors to create either a higher or lower voltage. Charge pumps are used in a variety of different applications such as, for example, applications involving Delay Locked Loops (DLLs) and Phase-Locked Loops (PLLs).

With respect to PLLs, a charge pump can be used to provide a control voltage applied to a Voltage Controlled Oscillator (VCO). Typically, a PLL includes a phase detector, a loop filter coupled to the output of the charge pump, an amplifier, and a VCO interconnected in a known manner to form a feedback system. The charge pump converts logic level pulses generated by the phase detector into current pulses which are fed to the loop filter. The loop filter integrates the current pulses to produce a control voltage for the VCO.

With respect to DLLs, a charge pump can be used to provide a control voltage for a Voltage Control Delay Line (VCDL) of the DLL. As will be appreciated by those skilled in the art, in certain types of devices (for example, DRAM devices) a DLL can be used to change the phase of a clock signal. In this regard, a DLL includes a delay chain composed of number of delay gates connected in series (in a daisy chain manner).

Those skilled in the art will appreciate that, besides those applications involving DLLs and PLLs, there will be other applications where, for example, a charge pump will be employed in an electronic circuit having an accurately controlled current source/sink for voltage regulation on a filter or reservoir capacitor.

SUMMARY OF THE INVENTION

According to one example embodiment, there is a method for clamping current in a charge pump. The charge pump includes switching circuitry and a capacitor. The charge pump defines first and second paths. For each of the first and second paths, a selected one of the following holds i) current is transmitted to the capacitor; and ii) current is received from the capacitor. At least one parasitic spike in current from at least one of a number of transistors of the switching circuitry is generated during switching off of the at least one transistor. The at least one parasitic spike is dissipated after elapse of a short period of time. The method includes the step of providing at least one control signal that causes the switching off of the at least one transistor when the at least one control signal changes from a first value to a second value. The method also includes the step of opening an additional path for the current from the at least one of the transistors when the at least one control signal changes from the first value to the second value in order that the at least one parasitic spike is only partially communicated through a selected one of the first and second paths. The method also includes the step of closing the additional path after the additional path has been open for the short period of time.

According to another example embodiment, there is a circuit for clamping current in a charge pump. The charge pump includes switching circuitry and a capacitor, and the charge pump defines first and second paths. For each of the first and second paths, a selected one of the following holds i) current is transmitted to the capacitor; and ii) current is received from the capacitor. At least one parasitic spike in current from at least one of a number of transistors of the switching circuitry is generated during switching off of the at least one transistor. The circuit includes first and second pairs of transistors, each of the transistors supporting on and off states, and each including a control electrode to permit transition between the states to be controlled. One of the first pair of transistors is electrically connected to a first of the transistors of the switching circuitry through a first node. The first path extends through the first node. One of the second pair of transistors is electrically connected to a second of the transistors of the switching circuitry through a second node. The second path extends through the second node. The circuit also includes first delay introducing inverter circuitry and second delay introducing inverter circuitry, each of the first inverter circuitry and the second inverter circuitry having an input signal connected to the control electrode of the one of the respective pair of transistors and a delayed output signal connected to the control electrode of the other of the respective pair of transistors. For a moment when the switching off occurs, both the input signal and the delayed output signal have values that produce the on state. At least one of the first and second pairs of transistors provide an additional path for the current from the at least one of the transistors during the switching off so that the at least one parasitic spike is only partially communicated through any paths to the capacitor.

According to another example embodiment, there is an apparatus including a charge pump. The charge pump includes a number of switching transistors, a current clamping circuit and a capacitor. The charge pump defines first and second paths. For each of the first and second paths, a selected one of the following holds i) current is transmitted to the capacitor; and ii) current is received from the capacitor. One of the switching transistors is located on a selected one of the first and second paths. The switching transistor generates a parasitic spike in current when it switches off. The parasitic spike is dissipated after elapse of a short period of time. An input providing a control signal for causing the switching off of the switching transistor when the control signal changes from a first value to a second value. The current clamping circuit (i) opens an additional path for the current from the switching transistor when the control signal changes from the first value to the second value in order that the parasitic spike is only partially communicated through the one of the first and second paths; and (ii) closes the additional path after the additional path has been open for the short period of time.

According to another example embodiment, there is a method for clamping current in a charge pump. The charge pump includes switching circuitry and a capacitor, and the charge pump defines first and second paths. For each of the first and second paths, a selected one of the following holds i) current is transmitted to the capacitor; and ii) current is received from the capacitor. At least one parasitic spike in current from at least one of a number of transistors of the switching circuitry is generated during switching off of the at least one transistor. The method includes the step of providing at least one control signal that causes the switching off of the at least one transistor when the at least one control signal changes from a first value to a second value. The method also includes the step of opening an additional path for the current from the at least one of the transistors when the at least one control signal changes from the first value to the second value in order that the at least one parasitic spike is only partially communicated through a selected one of the first and second paths. The additional path is provided to the at least one of the transistors through a first node. Voltage at the first node changing in value during the switching off of the at least one transistor. The method also includes the step of, after the at least one of the transistors has switched off, minimizing leakage current flow through a transistor on the one of the first and second paths, relative to the capacitor.

Conveniently, the step of minimizing the leakage current flow may include preventing voltage at the first node from drifting away from a fixed voltage value while the at least one transistor is switched off.

Expediently, the method may further include the step of closing the additional path momentarily after its having been opened.

According to another example embodiment, there is an apparatus including a charge pump. The charge pump includes a number of switching transistors, a current clamping circuit and a capacitor, and the charge pump defines first and second paths. For each of the first and second paths, a selected one of the following holds i) current is transmitted to the capacitor; and ii) current is received from the capacitor. One of the switching transistors and a first node are located on a selected one of the first and second paths. The switching transistor generates a parasitic spike in current when it switches off. A circuit is capable of providing control signals for causing the switching off of the switching transistor when one of the control signals changes from a first value to a second value. The current clamping circuit (i) opens an additional path for the current from the switching transistor when the control signal changes from the first value to the second value in order that the parasitic spike is only partially communicated through the one of the first and second paths. The additional path is provided to the switching transistor through the first node. Voltage at the first node changing in value during the switching off of the switching transistor. The current clamping circuit also (ii) after the at least one of the transistors has switched off, minimes leakage current flow through a transistor on the one of the first and second paths, relative to the capacitor.

Conveniently, the minimizing of the leakage current flow may include preventing voltage at the first node from drifting away from a fixed voltage value while the at least one transistor is switched off.

Expediently, the charge pump may further include first and second FETs both electrically connected to the capacitor, the first FET positioned along the first path, the second FET positioned along the second path.

Conveniently, the current clamping circuit may include two transistors connected in series and located along the additional path, the current clamping circuit coupling the first node to a second node between the two transistors when the additional path becomes open.

Expediently, the charge pump may further define a Vc node at the capacitor, and the current clamping circuit may include a repeater for generating a replica of voltage at the Vc node, the replicated voltage being coupled to the first node once the additional path becomes open.

Accordingly, it would be advantageous to improve circuits for clamping current in a charge pump.

BRIEF DESCRIPTION OF THE DRAWINGS

Reference will now be made, by way of example, to the accompanying drawings.

Similar or the same reference numerals may have been used in different figures to denote similar components.

DETAILED DESCRIPTION OF THE INVENTION

In the following detailed description of example embodiments, a number of illustrated circuits and circuit components are of a type which performs known operations on electronic signals. Those skilled in the art will have knowledge of alternative circuits or circuit components which are recognized as equivalent because they provide the same operations on the signals.

Figure 1:
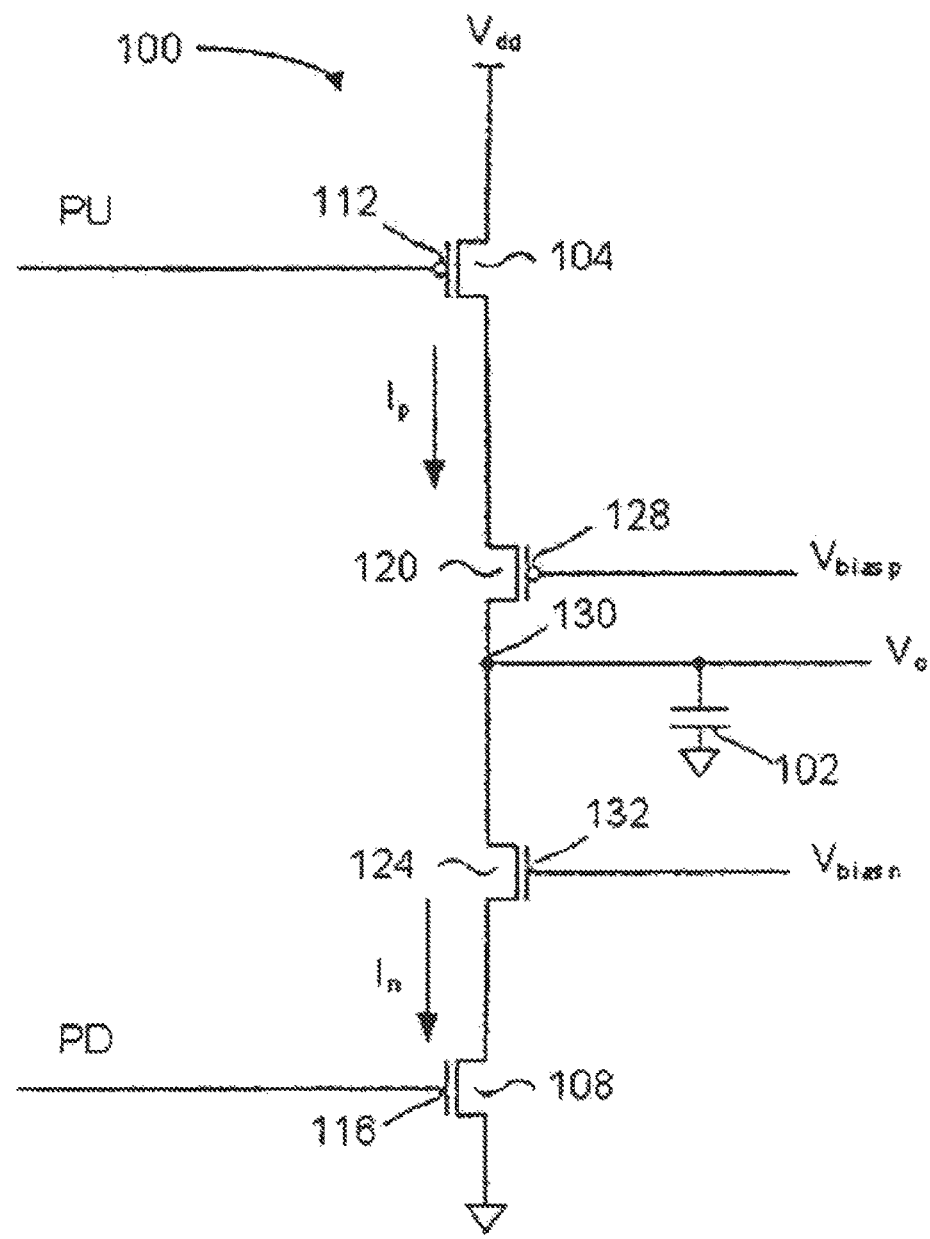
FIG. 1 is a circuit schematic representation of a charge pump.

Referring now to the drawings, FIG. 1 is a circuit schematic representation of a charge pump 100. In some examples, the charge pump 100 will be a part of a memory circuit (for instance, DRAM) and used in a PLL to control a voltage applied to a VCO. In other examples, the charge pump 100 may similarly be a part of some memory circuit, but used in, for instance, a DLL instead of a PLL. In additional examples, the charge pump 100 may be a part of clock management/distribution circuitry, a memory interface, an FPGA module, etc.

The charge pump 100 includes a capacitor 102. The charge pump 100 also includes switching circuitry, which in the illustrated example is comprised of a PMOS switching transistor 104 and an NMOS switching transistor 108. The switching transistor 104 is switched in response to a pump-up (PU) control signal applied at its gate 112. The switching transistor 108 is switched in response to a pump-down (PD) control signal applied at its gate 116.

With respect to the illustrated charge pump 100, neither the switching transistor 104, nor the switching transistor 108 is directly connected to output node Vc. Those skilled in the art will have knowledge of circuits wherein the switching transistors are directly connected to the output node; however, one drawback of such a configuration is the induction of parasitic noise into the output node at those instances in which there is a signal transition at the gates of the switching transistors.

In the illustrated example, connected between the two switching transistors 104 and 108 are a PMOS transistor 120 and an NMOS transistor 124, each having a bias voltage applied to their gate. In some examples, a current mirror will be employed to implement a voltage reference source that provides the bias voltage. The transistor 120 with a Vbiasp applied at its gate 128 is in a state permitting current Ip to flow through its channel, sourced into node 130 when the switching transistor 104 is on as dictated by the signal PU applied at the gate 112. As will be appreciated by those skilled in the art, a gate is the control electrode of an FET permitting transition between on and off states of the FET to be controlled. In other types of transistors, the control electrode is not necessarily termed a gate. For example, in a bipolar transistor the term "base" is typically used in reference to the control electrode of the bipolar transistor.

It will be understood that the switching transistor 104 is switched on when the signal PU changes from logic "high" to logic "low". Vice versa, the switching transistor 104 is switched off when the signal PU changes from logic low to logic high. Conversely, the transistor 124 with a Vbiasn applied at its gate 132 is in a state permitting current In to flow through its channel so as to be drained from the node 130 when the switching transistor 108 is on as dictated by the signal PD applied at the gate 116. It will be understood that the switching transistor 108 is switched on when the signal PD changes from logic low to logic high. Vice versa the switching transistor 108 is switched off when the signal PD changes from logic high to logic low.

For convenience of reference, it would be accurate to describe the charge pump 100 as having both a source portion and a sink portion. The transistors 112 and 120 are a part of the source portion. The transistors 116 and 124 are a part of the sink portion. (Those skilled in the art will appreciate that the "sink portion" may alternatively be referred to as the "drain portion".)

Figure 2:
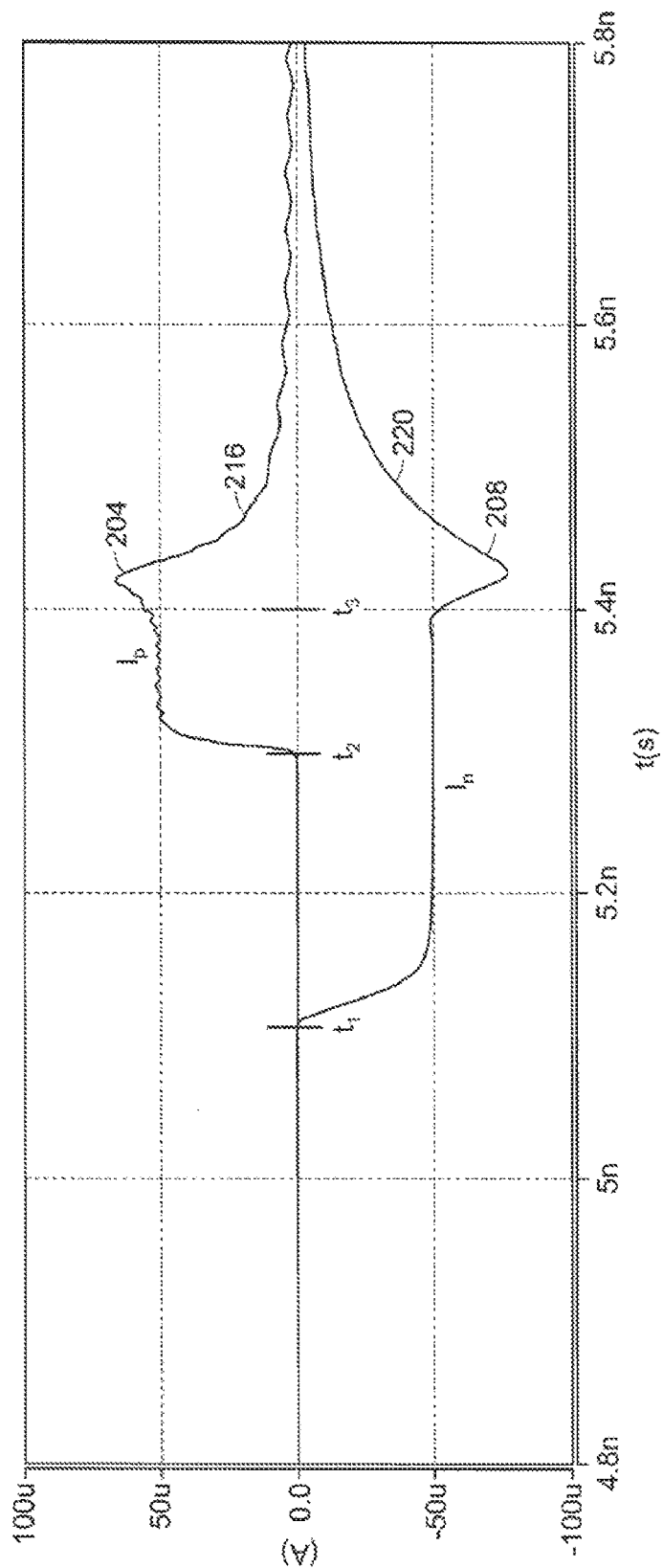
FIG. 2 is an example waveform graph illustrating currents through particular paths of the circuit of FIG. 1 over time.

FIG. 2 is an example waveform graph illustrating currents Ip and In over time. In the graph of FIG. 2, times t1, t2 and t3 correspond to instances in time during which one or more of the switching transistors 104 and 108 are switched on or off. In particular, at about time t1 the switching transistor 108 is switched on, at about time t2 the switching transistor 104 is switched on, and at about time t3 both the switching transistors 104 and 108 are switched off.

Referring to time t3, it will be seen that there is an upward spike 204 in the current Ip as the switching transistor 104 is switched off. Also at time t3, there is a downward spike 208 in the current In as the switching transistor 108 is switched off. An explanation for the current spikes 204 and 208 are as follows. When either the switching transistor 104 or 108 is switching off, they generate current as a result of switching signal coupling caused by gate-to-drain capacitances. This current is added to the current already flowing through the transistor. In the charge pump of FIG. 1, this added current has nowhere to go except through the respective adjacent transistor 120 or 124.

As will be appreciated by those skilled in the art, the current spikes 204 and 208 will cause error in the loop of the DLL/PLL resulting in a phase offset. At least one reason for this will be due to the fact that the current spike 204 is not symmetrical to the current spike 208. Also, current tail outs 216 and 220 may also cause error in the loop of the DLL/PLL. As will be appreciated by those skilled in the art, the current tail outs 216 and 220 exist because the transistors 120 and 124 shut off gradually as opposed to quickly (the voltage at the sources of the transistors 120 and 124 transition to a shut-off voltage value gradually rather than quickly).

Figure 3:
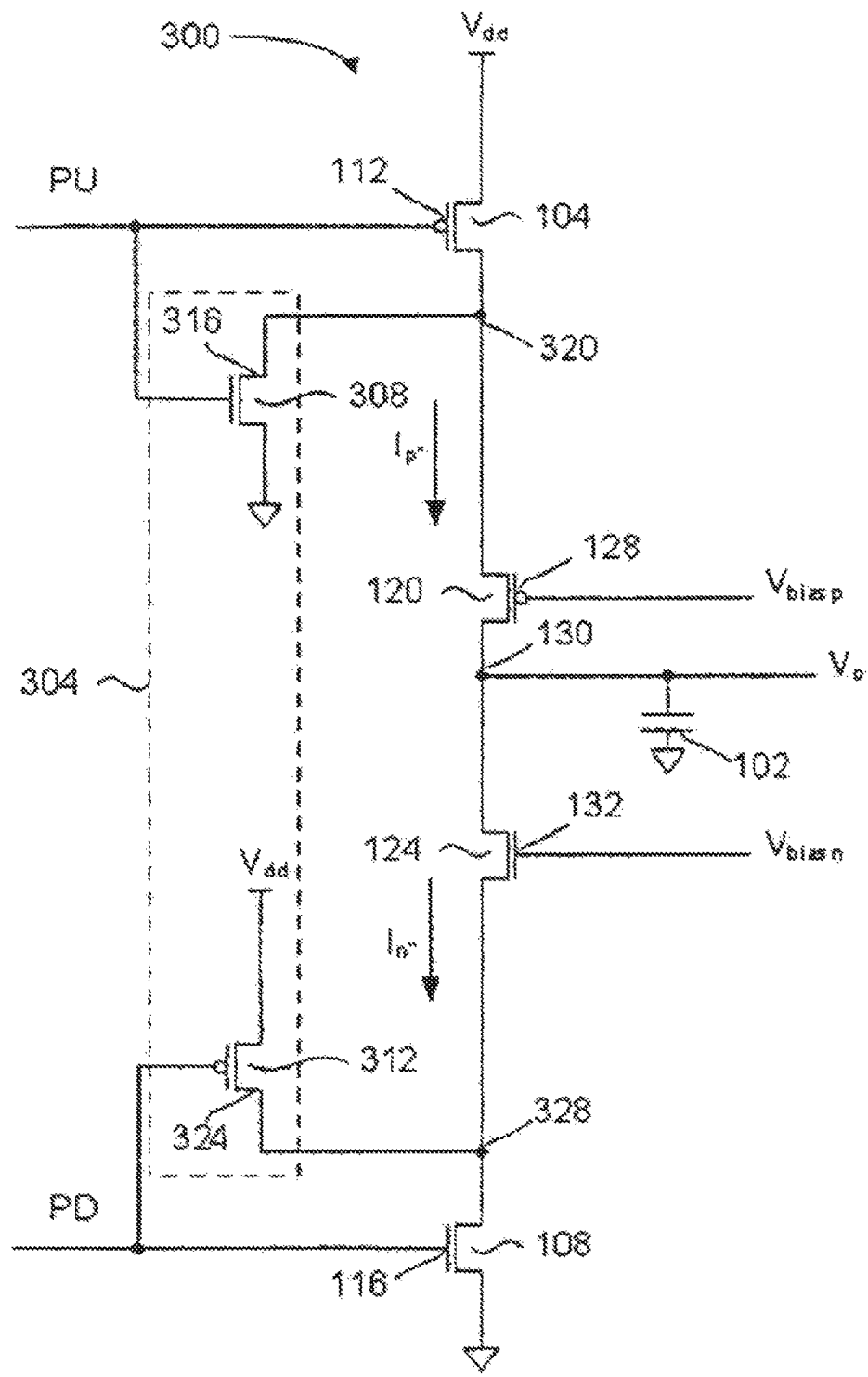
FIG. 3 is a circuit schematic representation of another charge pump similar in certain respects to the charge pump of FIG. 1, but additionally including a static clamp.

FIG. 3 is a circuit schematic representation of another charge pump 300 similar in certain respects to the charge pump of FIG. 1, but additionally including a static clamp 304 to provide a path for off-switching current from the switching transistors 104 or 108. The illustrated static clamp 304 comprises an NMOS transistor 308 and a PMOS transistor 312. Drain 316 of the transistor 308 is electrically connected to the switching transistor 104 through node 320. With respect to the transistor 312, its drain 324 is electrically connected to the switching transistor 108 through node 328.

It will be understood that the static clamp 304 of the charge pump 300 acts to abate current spikes along a path between the switching transistor 104 and the capacitor 102 during off-switching of the switching transistor 104 by providing an additional path for current, and likewise along another path between the switching transistor 108 and the capacitor 102 during off-switching of the switching transistor 108, also by providing an additional path for current. In terms of the designed impact that the static clamp 304 would have on the waveforms shown in FIG. 2, the current spikes would be significantly smaller in size as compared to the illustrated current spikes 204 and 208. Also, the current tail outs would be reduced.

A limitation of the static clamp 304 when used within the charge pump 300 is that Vc is constricted to a range having an upper limit defined by Vbiasp and a lower limit defined by Vbiasn. As will be appreciated by one skilled in the art, this Vc limitation is caused by the transistors 308 and 312 remaining turned on even after the switching transistors 104 and 108 have switched off. In particular, the voltage at the node 320 will approach ground potential once the switching transistor 104 has been switched off. If Vc is brought above Vbiasp, current will flow through the transistor 120 in a direction opposite the direction shown by the arrow for current Ip" (the higher the voltage value to which Vc is brought, the greater the leakage current) and current Ip" will have an undesirable effect on the value of Vc. Similarly, the voltage at the node 328 will approach Vdd once the switching transistor 108 has been switched off. If Vc is brought below Vbiasn, current will flow through the transistor 124 in a direction opposite the direction shown by the arrow for current In" (in this case the lower the voltage value to which Vc is brought, the greater the leakage current) and so current In" will have an undesirable effect on the value of Vc.

Figure 4:
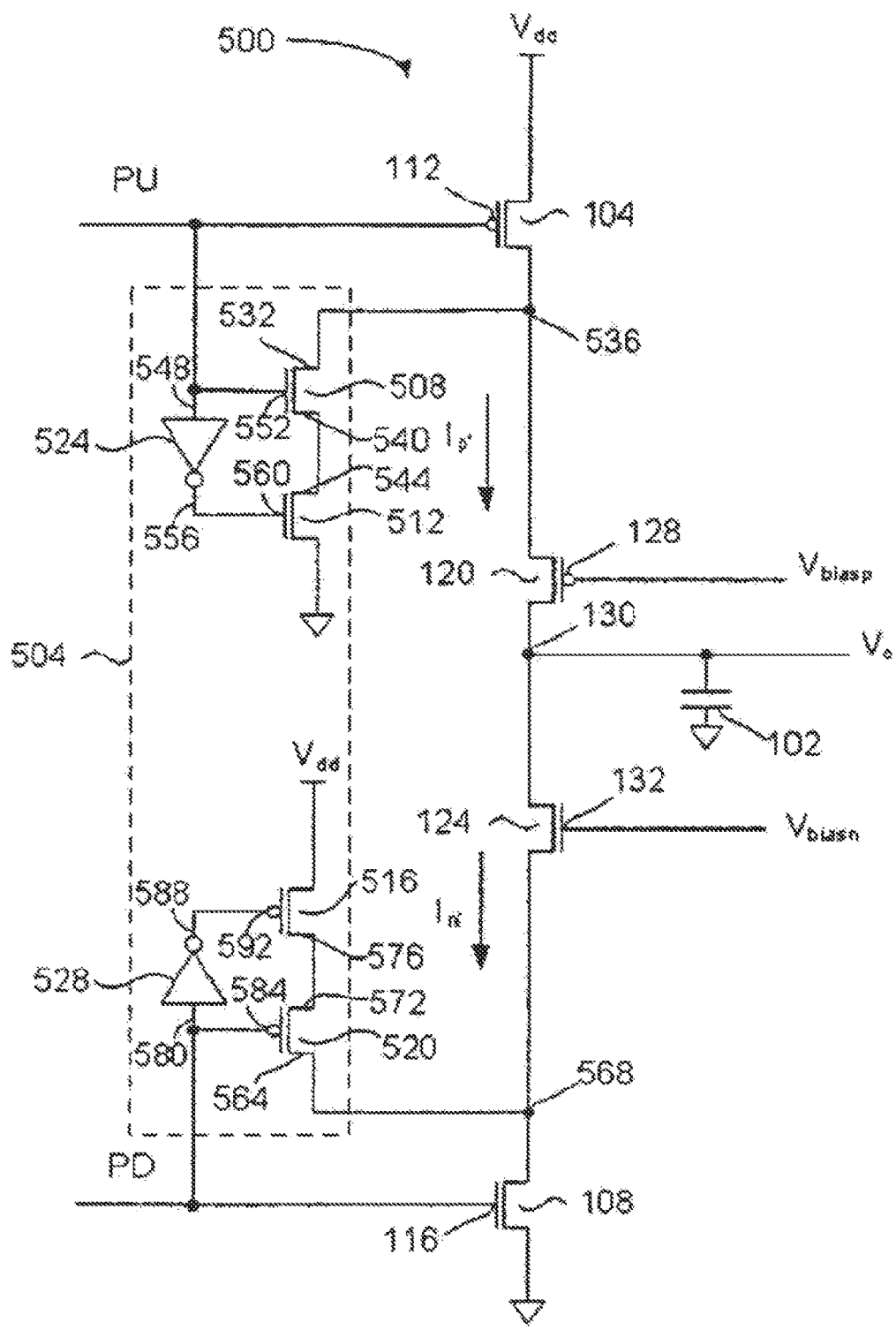
FIG. 4 is a circuit schematic representation of another charge pump similar in certain respects to the charge pump of FIG. 1, but additionally including a clamp in accordance with an example embodiment.

Reference will now be made to FIG. 4. FIG. 4 is a circuit schematic representation of another charge pump 500 similar in certain respects to the charge pump of FIG. 1, but additionally including a clamp 504 in accordance with an example embodiment. Like the static clamp 304 (FIG. 3), the clamp 504 can provide an additional path for off-switching current from either of the switching transistors 104 or 108; however, unlike the static clamp 304, the clamp 504 does not force Vc to be constricted to a range within the limits defined by Vbiasp and Vbiasn.

The illustrated clamp 504 comprises a pair of NMOS transistors 508 and 512, a pair of PMOS transistors 516 and 520, a delay introducing inverter circuitry (or inverter) 524, and another delay introducing inverter circuitry 528. (Each of the inverters 524 and 528 can be implemented using a well known combination of transistors such as an NMOS-PMOS transistor pair, for example. Also, although the delay introducing inverter circuitry 524 and the delay introducing inverter circuitry 528 are each shown as only a single inverter in FIG. 4, it will be understood that in some examples the delay introducing inverter circuitry can comprise three or more actual inverters as opposed to a single inverter.)

It will be understood that optimal delay introducible by inverter circuitry in clamps according to example embodiments will vary depending upon a variety of factors. These factors can include, for example, the size of the transistors that are providing the additional path for current and the size of the transistors used to implement the inverter circuitry.

In the illustrated example embodiment, half of the clamp 504, comprising the transistor 508, the transistor 512 and the inverter 524, is in operative communication with the\ switching transistor 104, and the other half of the clamp 504, comprising the transistor 516, the transistor 520 and the inverter 528, is in operative communication with the switching transistor 108.

With respect to the half of illustrated clamp 504 that is in operative communication with the switching transistor 104, drain 532 of the transistor 508 is electrically connected to the switching transistor 104 through node 536. Also, source 540 of the transistor 508 is electrically connected to drain 544 of the transistor 512. Both input 548 of the inverter 524 and gate 552 of the transistor 508 are applied with the same signal, namely PU. Output 556 of the inverter 524 is electrically connected to gate 560 of the transistor 512.

With respect to the half of illustrated clamp 504 that is in operative communication with the switching transistor 108, drain 564 of the transistor 520 is electrically connected to the switching transistor 108 through node 568. Also, source 572 of the transistor 520 is electrically connected to drain 576 of the transistor 516. Both input 580 of the inverter 528 and gate 584 of the transistor 520 are applied with the same signal, namely PD. Output 588 of the inverter 528 is electrically connected to gate 592 of the transistor 516.

During simultaneous off-switching of the switching transistors 104 and 108 (of course it will be understood that in at least some examples the two transistors need not be switched off at the same time) the operation of the illustrated clamp 504 will be as follows. For a brief period of time, the duration of which will be determined by the delay of the inverters 524 and 528, two transistor pairs forming a part of the clamp 504 will provide paths for abating current spikes during off-switching of the switching transistors 104 and 108. These paths will exist because both transistors of each pair will be turned on. However, after elapse of the inverter delay-determined period of time, neither transistor pair will have both transistors turned on so the clamping effect of the transistor pairs will be removed, leaving a greater flexibility for Vc to be set as desired (i.e. not constricted to a range within the limits defined by Vbiasp and Vbiasn).

Figure 5:
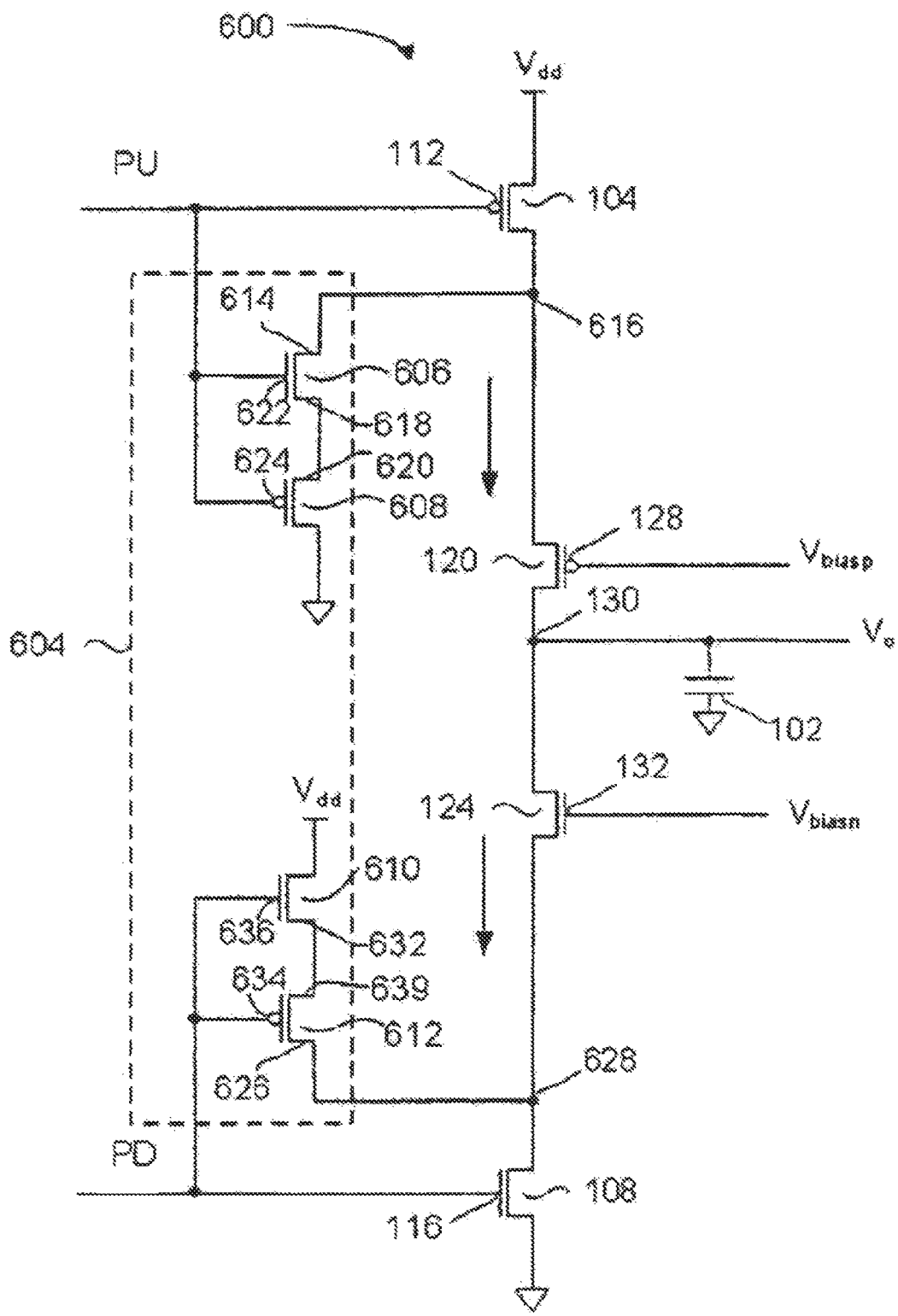
FIG. 5 is a circuit schematic representation of another charge pump that includes a clamp in accordance with a second example embodiment.

Reference will now be made to FIG. 5. FIG. 5 is a circuit schematic representation of another charge pump 600 similar in certain respects to the charge pump of FIG. 4, but including a clamp 604 in accordance with an alternative example embodiment. Like other clamps illustrated and described herein, the clamp 604 does not force Vc to be constricted to a range within the limits defined by Vbiasp and Vbiasn.

The illustrated clamp 604 comprises a first pair of transistors 606 and 608, and a second pair of transistors 610 and 612. In at least one example, the transistors 606 and 610 are NMOS transistors, and the transistors 608 and 612 are PMOS transistors.

In the illustrated example embodiment, half of the clamp 604, comprising the transistors 606 and 608 are in operative communication with the switching transistor 104, and the other half of the clamp 604, comprising the transistors 610 and 612 are in operative communication with the switching transistor 108.

With respect to the half of illustrated clamp 604 that is in operative communication with the switching transistor 104, drain 614 of the transistor 606 is electrically connected to the switching transistor 104 through node 616. Also, source 618 of the transistor 606 is electrically connected to source 620 of the transistor 608. Both gate 622 of the transistor 606 and gate 624 of the transistor 608 are applied with the same signal, namely PU.

With respect to the half of illustrated clamp 604 that is in operative communication with the switching transistor 108, drain 626 of the transistor 612 is electrically connected to the switching transistor 108 through node 628. Also, source 630 of the transistor 612 is electrically connected to source 632 of the transistor 610. Both gate 634 of the transistor 612 and gate 636 of the transistor 610 are applied with the same signal, namely PD.

When the signal PD is logic high, the transistors 108 and 610 will be conducting, whereas the transistor 612 will not be conducting. During this time, the node between the sources 630 and 632 is pre-charged to a voltage level roughly equal to the threshold voltage level of the NMOS transistor 610. When the signal PD goes logic low, the transistor 610 turns off cutting off the leakage path. Also, the PMOS transistor 612 turns on providing for charge exchange between the node 628 and the node between the sources 630 and 632. For example, charge exchange occurs between the parasitic capacitances of the two transistors 610 and 612. During this time of charge exchange, an additional current path through the node 628 is provided, in order that the parasitic current spike will only partially travel through the path between the switching transistor 108 and the capacitor 102. As a result of the charge exchange, the voltage level of the node 628 is driven sharply up making the transistor 124 cut off sharply. The new voltage value to which voltage at the node 628 transitions is maintained while the switching transistor 108 is switched off, in order that leakage current flow is minimized during this passive phase.

Similarly, when the signal PU is logic low, the transistors 104 and 608 will be conducting, and the transistor 606 will not be conducting. When the signal PU goes logic high, the transistor 608 will turn off cutting off leakage path. Also, the transistor 606 turns on providing for charge exchange between the node 616 and the node between the two sources 618 and 620. For example, charge exchange occurs between parasitic capacitances of the transistors 606 and 608. During this time of charge exchange, an additional current path through the node 616 is provided, in order that the parasitic current spike will only partially travel through the path between the switching transistor 104 and the capacitor 102. As a result of the charge exchange, the voltage level of the node 616 is driven sharply down making the transistor 120 cut off sharply. The new voltage value to which voltage at the node 616 transitions is maintained while the switching transistor 104 is switched off, in order that leakage current flow is minimized during this passive phase.

Figure 6:
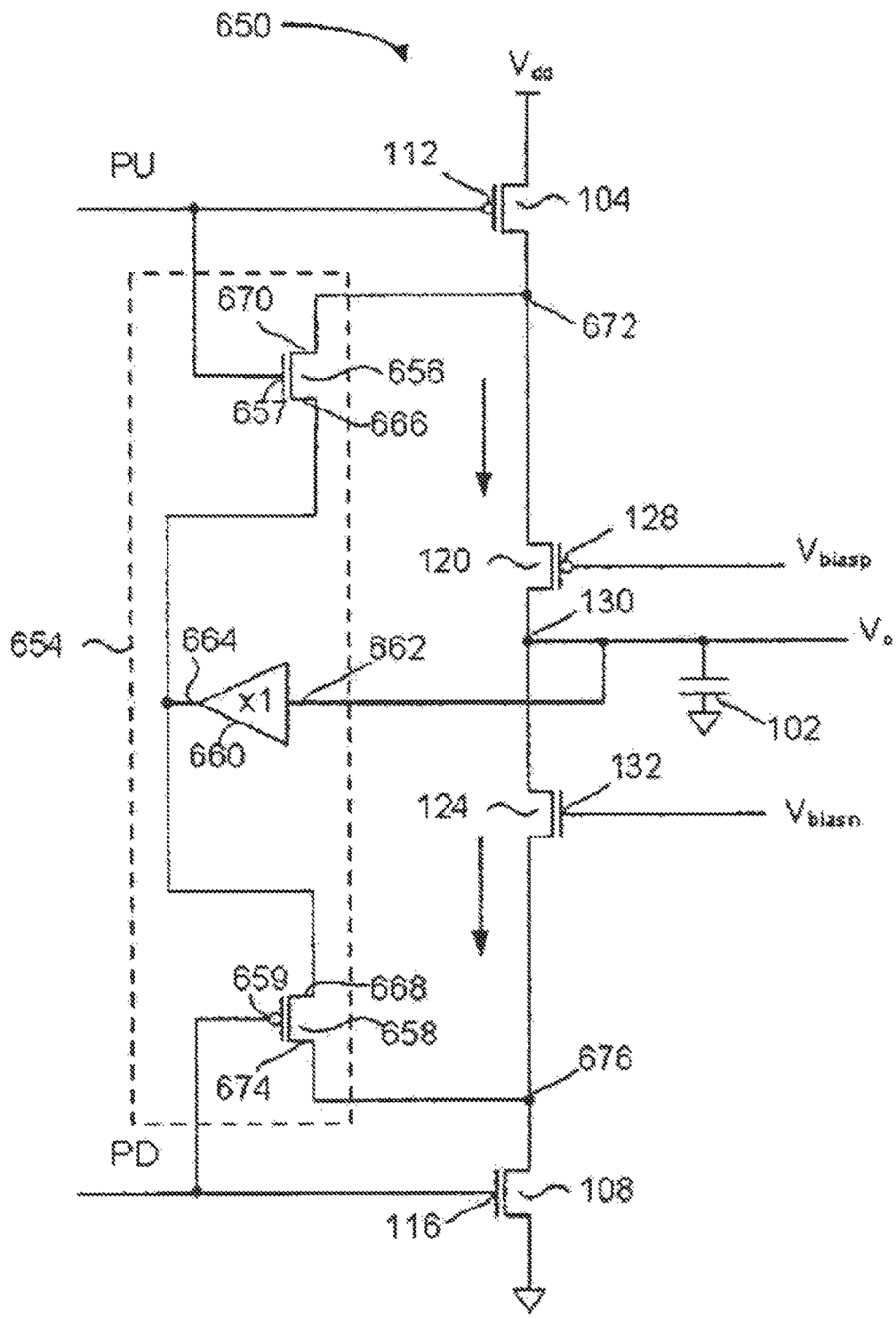
FIG. 6 is a circuit schematic representation of another charge pump that includes a clamp in accordance with a third example embodiment.

Reference will now be made to FIG. 6. FIG. 6 is a circuit schematic representation of another charge pump 650, again similar in certain respects to the charge pump of FIG. 4, but including a clamp 654 in accordance with an another alternative example embodiment. Like other clamps illustrated and described herein, the clamp 654 does not force Vc to be constricted to a range within the limits defined by Vbiasp and Vbiasn.

The illustrated clamp 654 comprises an NMOS transistor 656 having the signal PU applied at its gate 657, a PMOS transistor 658 having the signal PD applied at its gate 659, and an analogue repeater 660. Input 662 of the repeater 660 is connected to the node 130, whereas output 664 of the repeater 660 is electrically connected to source 666 of the transistor 656 and source 668 of the transistor 658.

Within the illustrated clamp 654, the transistor 656 is in operative communication with the switching transistor 104. In particular, drain 670 of the transistor 656 is electrically connected to the switching transistor 104 through node 672. Additionally, the transistor 658 is in operative communication with the switching transistor 108. In particular, drain 674 of the transistor 658 is electrically connected to the switching transistor 108 through node 676.

As will be appreciated by those skilled in the art, the transistor 656 will start conducting during off-switching as a result of a logic high signal applied to the gate 657. Thus, with the transistor 656 conducting, a replica of the Vc voltage provided by the repeater 660 is coupled to the node 672. Leakage current is minimized because the voltage drop across the leakage current path is small and the voltage at the node 672 is prevented from significantly falling in value while the transistor 104 is switched off. Also, the off-switching generated, parasitic current spike will only partially travel through the path between the switching transistor 104 and the capacitor 102 (again an additional current path through the node 672 is provided when the transistor 656 is conducting).

Similarly, during off-switching of the transistor 108, the transistor 658 will start conducting because of a logic high signal applied at the gate 659. Because the transistor 658 is conducting, a replica of the Vc voltage provided by the repeater 660 is coupled to the node 676. Again, leakage current is minimized because the voltage difference across the leakage current path is small and a voltage at the node 676 is prevented from rising by any significant amount while the transistor 108 is switched off. Furthermore, it will again be understood that the off-switching generated, parasitic current spike (sink portion of circuit) will only partially travel through the path between the switching transistor 108 and the capacitor 102 (again an additional current path through the node 676 is provided when the transistor 658 is conducting).

In some examples, the repeater 660 will be absent. For instance, the nodes 672 and 676 might be coupled directly to the node 130 during phases when the transistors 104 and 108 are switched off. There will however be some commutation charge injection in such instances. In particular, parasitic capacitances of the transistors 656 and 658 can cause commutation charge injections into the node 130.

Figure 7:
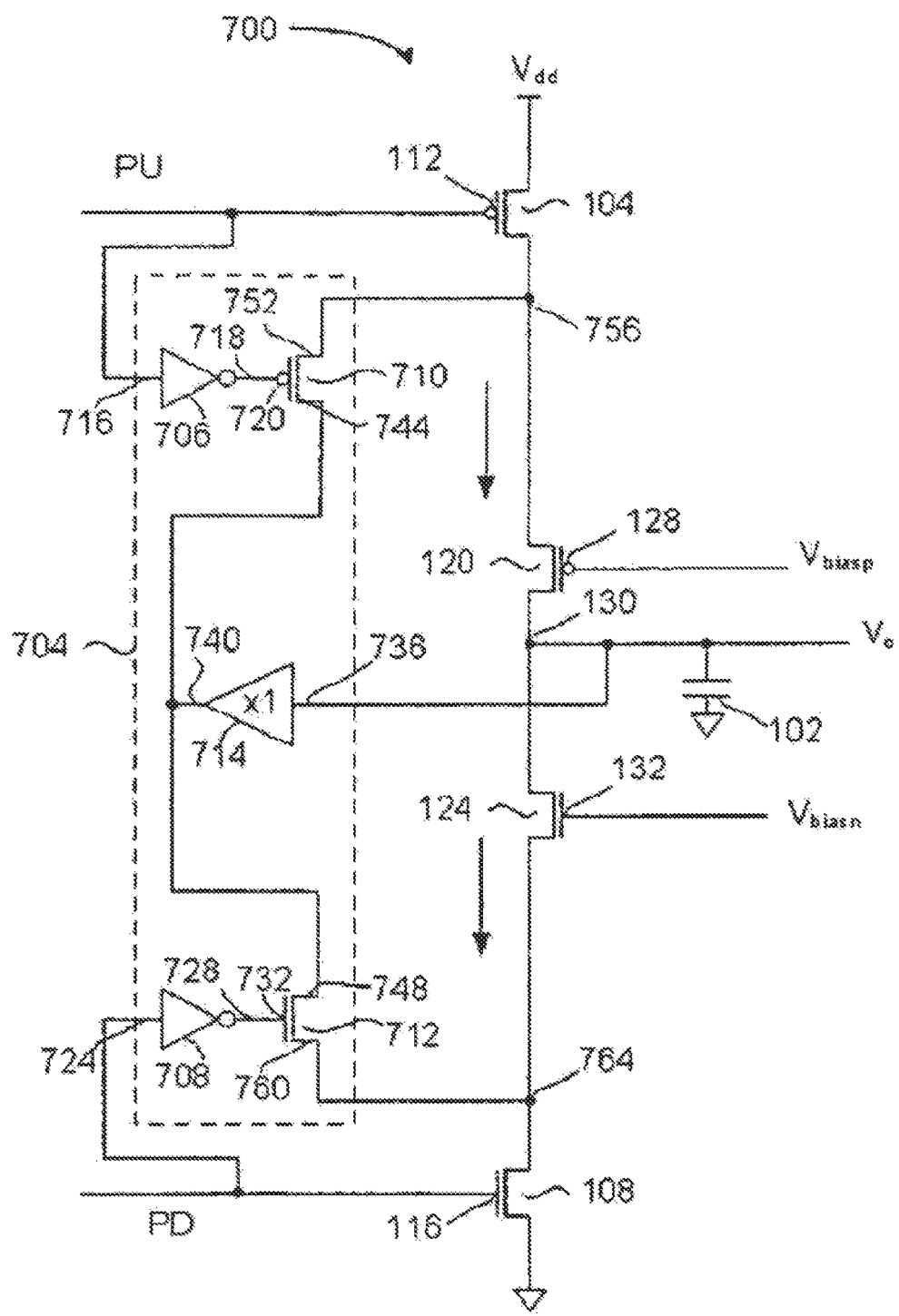
FIG. 7 is a circuit schematic representation of another charge pump that includes a clamp in accordance with a fourth example embodiment.

Reference will now be made to FIG. 7. FIG. 7 is a circuit schematic representation of another charge pump 700 that includes a clamp 704 in accordance with yet another alternative example embodiment. It will be seen that the charge pump 700 is similar in certain respects to other charge pumps previously illustrated and described. For example, like a number of other clamps illustrated and described herein, the clamp 704 does not force Vc to be constricted to a range within the limits defined by Vbiasp and Vbiasn.

The illustrated clamp 704 comprises two inverters 706 and 708, a PMOS transistor 710, an NMOS transistor 712 and an analogue repeater 714. In terms of circuit configuration, input 716 of the inverter 706 receives the signal PU and output 718 of the inverter 706 is applied to gate 720 of the transistor 710. Likewise, input 724 of the inverter 708 receives the signal PD and output 728 of the inverter 708 is applied to gate 732 of the transistor 712. Also, input 736 of the repeater 714 is connected to the node 130, whereas output 740 of the repeater 714 is electrically connected to drain 744 of the transistor 710 and drain 748 of the transistor 712.

Within the illustrated clamp 704, the transistor 710 is in operative communication with the switching transistor 104. In particular, drain 752 of the transistor 710 is electrically connected to the switching transistor 104 through node 756. Additionally, the transistor 712 is in operative communication with the switching transistor 108. In particular, drain 760 of the transistor 712 is electrically connected to the switching transistor 108 through node 764.

It will be understood that the clamp 704 of FIG. 7 is similar in operation to the clamp 654 of FIG. 6. Again, the illustrated repeater will not be present in all examples.

Figure 8:
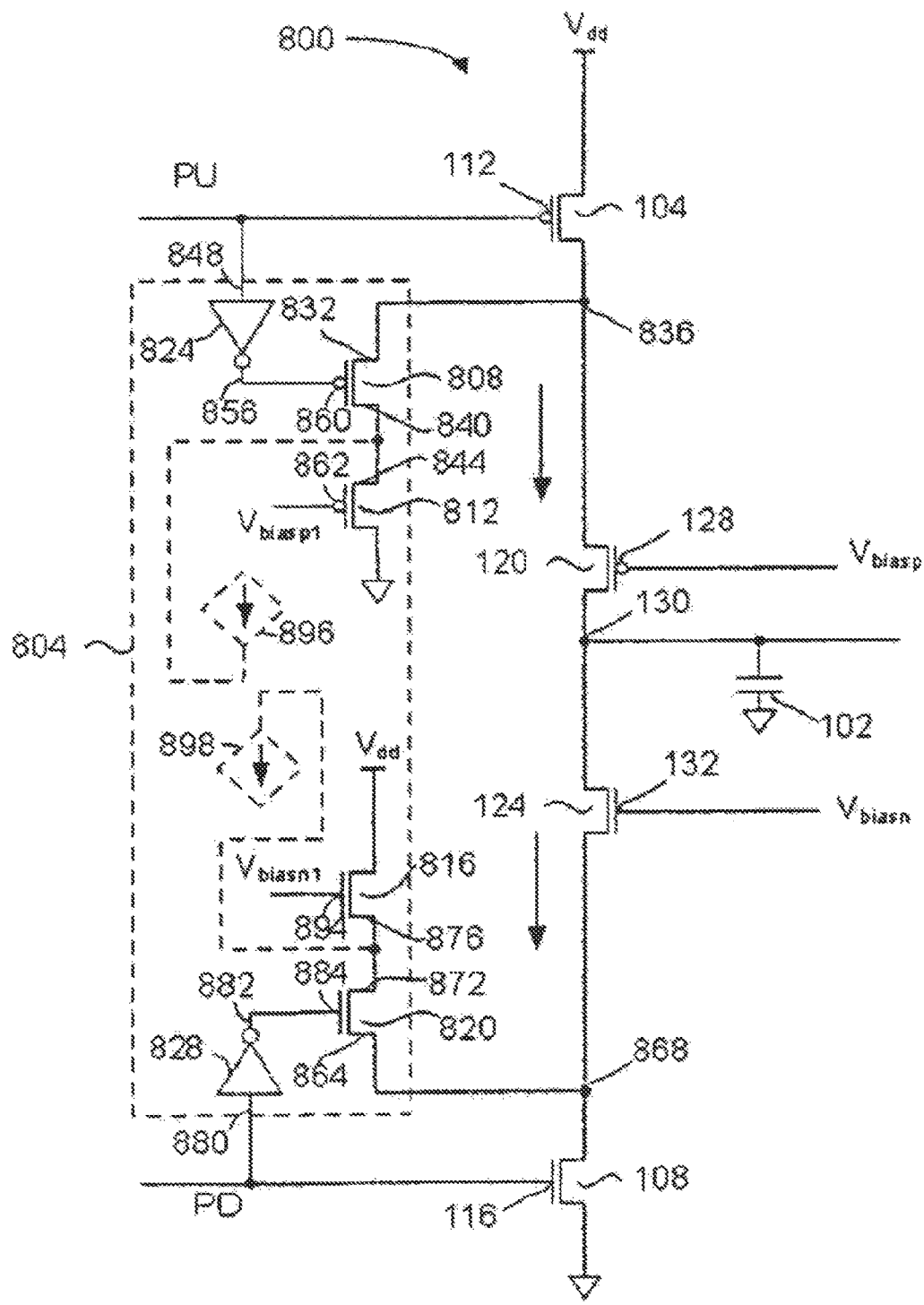
FIG. 8 is a circuit schematic representation of another charge pump that includes a clamp in accordance with a fifth example embodiment.

Reference will now be made to FIG. 8. FIG. 8 is a circuit schematic representation of another charge pump 800 that includes a clamp 804 in accordance with yet another alternative example embodiment. Once again, it will be seen that the charge pump 800 is similar in certain respects to other charge pumps previously illustrated and described. For example, like a number of other clamps illustrated and described herein, the clamp 804 does not force Vc to be constricted to a range within the limits defined by Vbiasp and Vbiasn.

The illustrated clamp 804 comprises a pair of PMOS transistors 808 and 812, a pair of NMOS transistors 816 and 820, and two inverters 824 and 828. Half of the clamp 804, comprising the transistor 808, the transistor 812 and the inverter 824, is in operative communication with the switching transistor 104, and the other half of the clamp 804, comprising the transistor 816, the transistor 820 and the inverter 828, is in operative communication with the switching transistor 108.

With respect to the half of illustrated clamp 804 that is in operative communication with the switching transistor 104, source 832 of the transistor 808 is electrically connected to the switching transistor 104 through node 836. Also, drain 840 of the transistor 808 is electrically connected to source 844 of the transistor 812, and the voltage at the node between the drain 840 and the source 844 will not drop to ground potential. Input 848 of the inverter 824 and the gate 112 of the transistor 104 are applied with the same signal, namely PU. Output 856 of the inverter 824 is electrically connected to gate 860 of the transistor 808. A signal Vbiasp1 is applied to gate 862 of the transistor 812. (In at least some examples, Vbiasp1 will have a similar, or essentially the same value as Vbiasp.)

With respect to the half of illustrated clamp 804 that is in operative communication with the switching transistor 108, source 864 of the transistor 820 is electrically connected to the switching transistor 108 through node 868. Also, drain 872 of the transistor 820 is electrically connected to source 876 of the transistor 816, and the voltage at the node between the drain 872 and the source 876 will not rise to Vdd. Input 880 of the inverter 828 and the gate 116 of the transistor 108 are applied with the same signal, namely PD. Output 882 of the inverter 828 is electrically connected to gate 884 of the transistor 820. A signal Vbiasn1 is applied to gate 894 of the transistor 816. (In at least some examples, Vbiasn, will have a similar, or essentially the same value as Vbiasn.)

Still with reference to the half of illustrated clamp 804 that is in operative communication with the switching transistor 108, it will be understood that during off-switching of transistor 108, the transistor 820 will start conducting, thus providing for the exchange of charge between the node 868 and the node between the drain 872 and the source 876 (for example, parasitic capacitances of the transistors 816 and 820 will exchange charge with each other). By appropriate selection of the size of the transistor 816 and the value of Vbiasn1, the voltage level at the node 868 can be caused to rise when the transistor 108 is switched off, thus producing a sharp cut-off of tail out current. In particular, the immediate voltage transition will be roughly from Vbiasn−VT_n to Vbiasn1−VT_n1. Also, the clamp 804 will restrict the voltage at the node 868 from falling below Vbiasn1−VT_n1, and because only miniscule leakage current will exist as long as the voltage at the node 868 does not fall below Vbiasn−VT_n, the clamp 804 will effectively maintain the voltage at the node 868 close to Vbiasn1−VT_n1 while the switching transistor 108 is switched off.

With reference to the half of illustrated clamp 804 that is in operative communication with the switching transistor 104, it will be understood that when the transistor 104 is switching off, the transistor 808 will start conducting, thus providing for the exchange of charge between the node 836 and the node between the drain 840 and the source 844 (for example, the parasitic capacitances of the transistors 808 and 812 will exchange charge with each other). By appropriate selection of the size of the transistor 812 and the value of Vbiasp1, a large enough drop in the voltage level at the node 836 will occur when the transistor 104 is switched off so as to produce a sharp cut-off of tail out current. In particular, the immediate voltage transition will be roughly from Vbiasp+VT_p to Vbiasp1+VT_p1. Also, the clamp 804 will restrict the voltage at the node 836 from rising above Vbiasp1+VT_p1, and because only miniscule leakage current will exist as long as the voltage at the node 836 does rise above Vbiasp+VT_p, the clamp 804 will effectively maintain the voltage at the node 836 close to Vbiasp1+VT_p1 while the switching transistor 104 is switched off.

An additional note in relation to the example embodiment illustrated in FIG. 8: a leakage current path does exist when either of the switching transistors is switched off. In particular, the leakage current paths are i) the path through the transistors 120, 808 and 812; and ii) the path through the transistors 124, 820 and 816; however, leakage current will be small as compared to, for example, the charge pump 300 shown in FIG. 3. Also, the clamp 804 may optionally include very small current sources 896 and 898 to further ensure maintenance of the voltage at the nodes 836 and 868 close to a constant value while the switching transistors are switched off. These current sources will counteract equally small currents caused by parasitic capacitances. In one example, the current source 896 is implemented using a PMOS transistor (with the source and gate of the PMOS transistor connected to Vdd and Vbiasp respectively) and the current source 898 is implemented using an NMOS transistor (with the source and gate of the NMOS transistor connected to ground potential and Vbiasn respectively).

Figure 9:
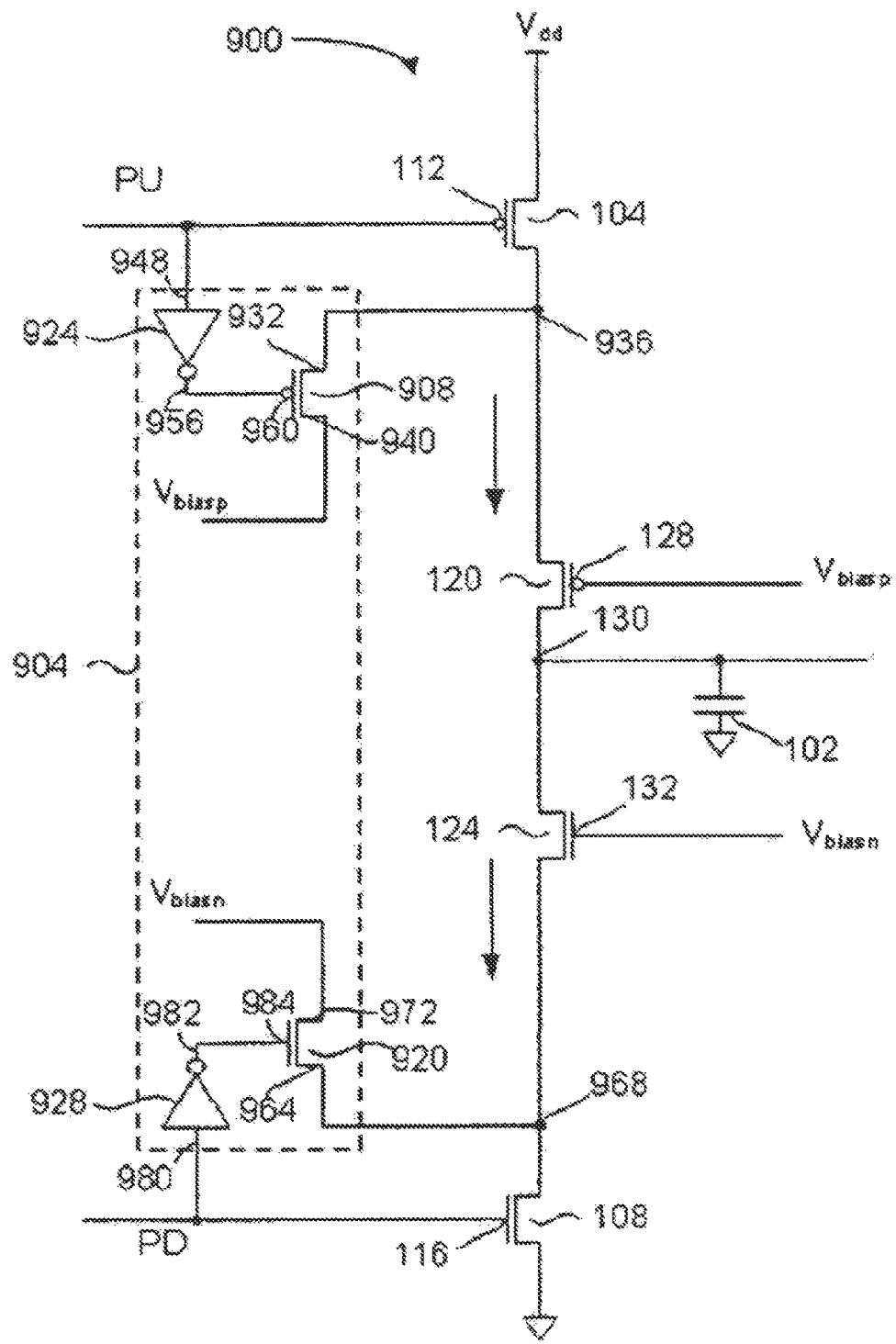
FIG. 9 is a circuit schematic representation of another charge pump that includes a clamp in accordance with a sixth example embodiment.

Reference will now be made to FIG. 9. FIG. 9 is a circuit schematic representation of another charge pump 900 that includes a clamp 904 in accordance with yet another alternative example embodiment. Once again, it will be seen that the charge pump 900 is similar in certain respects to other charge pumps previously illustrated and described. For example, like a number of other clamps illustrated and described herein, the clamp 904 does not force Vc to be constricted to a range within the limits defined by Vbiasp and Vbiasn.

The illustrated clamp 904 comprises a PMOS transistor 908, an NMOS transistor 920, and two inverters 924 and 928. Half of the clamp 904, comprising the transistor 908 and the inverter 924, is in operative communication with the switching transistor 104, and the other half of the clamp 904, comprising the transistor 920 and the inverter 928, is in operative communication with the switching transistor 108.

With respect to the half of illustrated clamp 904 that is in operative communication with the switching transistor 104, source 932 of the transistor 908 is electrically connected to the switching transistor 104 through node 936. Also, the signal Vbiasp is applied to drain 940 of the transistor 908. Input 948 of the inverter 924 and the gate 112 of the transistor 104 are applied with the same signal, namely PU. Output 956 of the inverter 924 is electrically connected to gate 960 of the transistor 908.

With respect to the half of illustrated clamp 904 that is in operative communication with the switching transistor 108, source 964 of the transistor 920 is electrically connected to the switching transistor 108 through node 968. Also, the signal Vbiasn is applied to drain 972 of the transistor 920. Input 980 of the inverter 928 and the gate 116 of the transistor 108 are applied with the same signal, namely PD. Output 982 of the inverter 928 is electrically connected to gate 984 of the transistor 920.

The operation of the clamp 904 is similar to the operation of the clamp 804 shown in FIG. 8. The primary difference between the two clamps is that the clamp 904 lacks the transistors 812, 816, and the corresponding biasing voltages applied to their gates. Instead, the drain 940 of the transistor 908 is coupled to Vbiasp, and similarly the drain 972 of the transistor 920 is coupled to Vbiasn.

Figure 10:
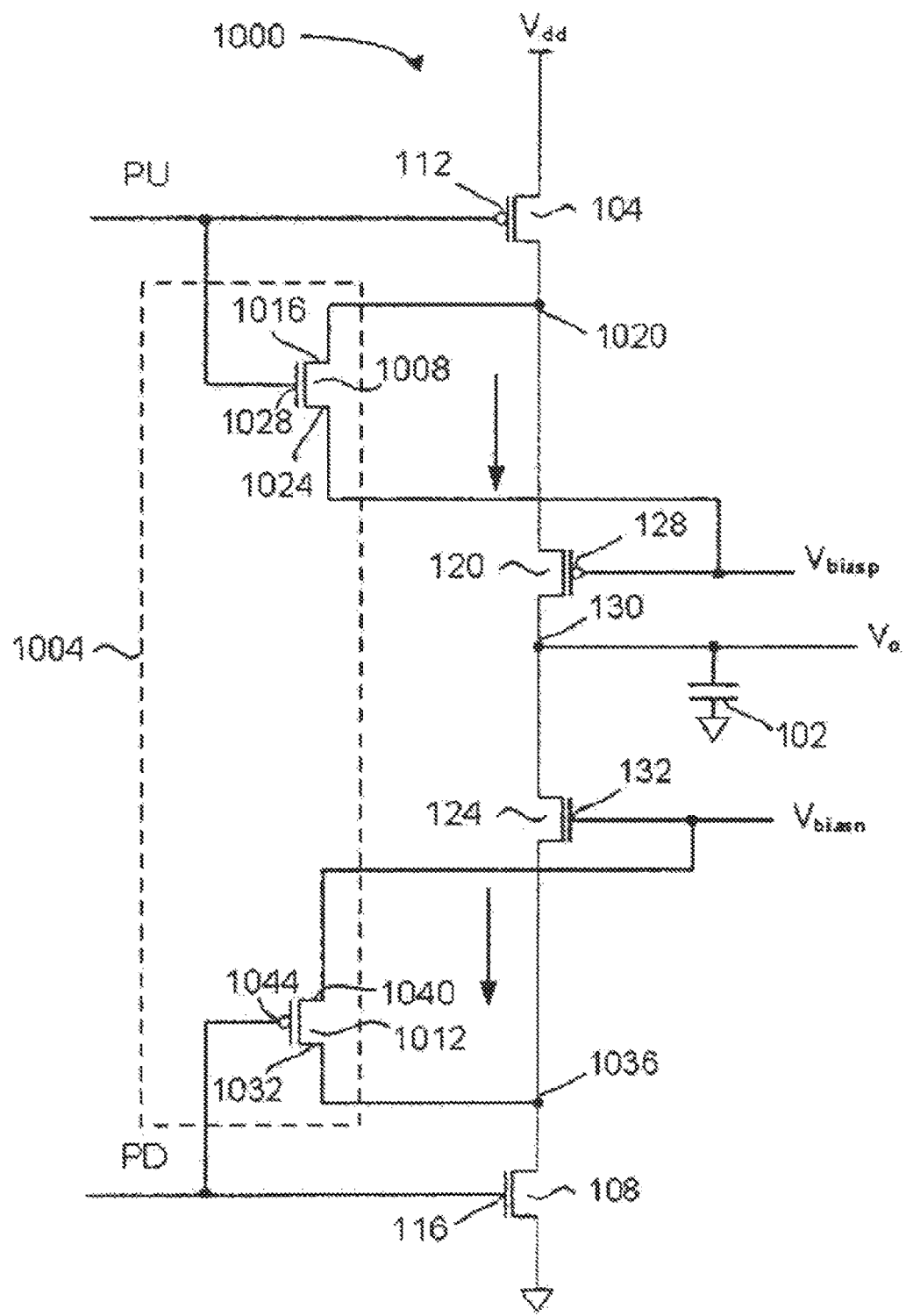
FIG. 10 is a circuit schematic representation of another charge pump that includes a clamp in accordance with a seventh example embodiment.

Reference will now be made to FIG. 10. FIG. 10 is a circuit schematic representation of another charge pump 1000 that includes a clamp 1004, in accordance with yet another alternative example embodiment, and which comprises an NMOS transistor 1008 and a PMOS transistor 1012. Once again, it will be seen that the charge pump 1000 is similar in certain respects to other charge pumps previously illustrated and described. For example, like a number of other clamps illustrated and described herein, the clamp 1004 does not force Vc to be constricted to a range within the limits defined by Vbiasp and Vbiasn. Also, it will be understood that the clamp 1004 is particularly similar to the clamp 904 shown in FIG. 9, the primary difference between the two clamps being that the inverters have been eliminated by replacing the PMOS transistor 908 with an NMOS transistor, and by replacing the NMOS transistor 920 with a PMOS transistor.

With respect to the NMOS transistor 1008, this transistor is in operative communication with the switching transistor 104. In particular, drain 1016 of the transistor 1008 is electrically connected to the switching transistor 104 through node 1020. Also, the signal Vbiasp is applied to drain 1024 of the transistor 1008. Gate 1028 of the transistor 1008 and the gate 112 of the transistor 104 are applied with the same signal, namely PU.

With respect to the PMOS transistor 1012, this transistor is in operative communication with the switching transistor 108. Drain 1032 of the transistor 1012 is electrically connected to the switching transistor 108 through node 1036. Also, the signal Vbiasn is applied to source 1040 of the transistor 1012. Gate 1044 of the transistor 1012 and the gate 116 of the transistor 108 are applied with the same signal, namely PD.

For some applications, effectiveness of the clamp 1004 may be improved by use of larger transistors (i.e. increasing the size of the transistor 1008 and/or the transistor 1012).

Figure 11:
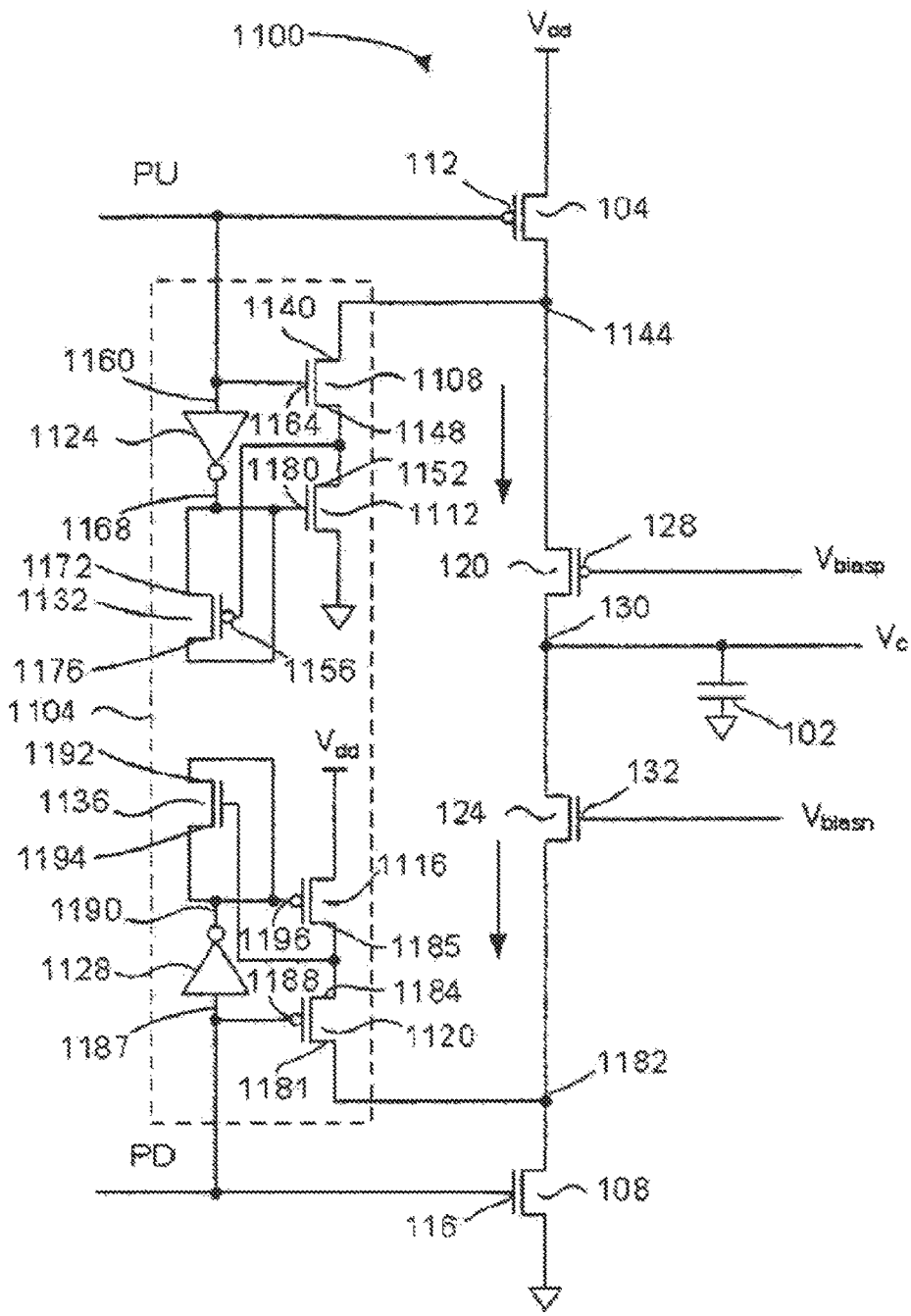
FIG. 11 is a circuit schematic representation of another charge pump that includes a clamp in accordance with an eighth embodiment.

Reference will now be made to FIG. 11. FIG. 11 is a circuit schematic representation of another charge pump 1100 that includes a clamp 1104 in accordance with yet another alternative example embodiment. Once again, it will be seen that the charge pump 1100 is similar in certain respects to other charge pumps previously illustrated and described. For example, like a number of other clamps illustrated and described herein, the clamp 1104 does not force Vc to be constricted to a range within the limits defined by Vbiasp and Vbiasn.

The illustrated clamp 1104 comprises a pair of NMOS transistors 1108 and 1112, a pair of PMOS transistors 1116 and 1120, a delay introducing inverter circuitry (or inverter) 1124, another delay introducing inverter circuitry 1128, and two additional transistors 1132 and 1136.

In the illustrated example embodiment, half of the clamp 1104, comprising the transistors 1108, 1112, 1132 and the inverter 1124, is in operative communication with the switching transistor 104, and the other half of the clamp 1104, comprising the transistors 1116, 1120, 1136 and the inverter 1128, is in operative communication with the switching transistor 108.

With respect to the half of illustrated clamp 1104 that is in operative communication with the switching transistor 104, drain 1140 of the transistor 1108 is electrically connected to the switching transistor 104 through node 1144. Also, source 1148 of the transistor 1108 is electrically connected to drain 1152 of the transistor 1112, as well as to gate 1156 of the transistor 1132. Both input 1160 of the inverter 1124 and gate 1164 of the transistor 1108 are applied with the same signal, namely PU. Output 1168 of the inverter 1124 is electrically connected to both source 1172 and drain 1176 of the transistor 1132, as well as to gate 1180 of the transistor 1112.

With respect to the half of illustrated clamp 1104 that is in operative communication with the switching transistor 108, drain 1181 of the transistor 1120 is electrically connected to the switching transistor 108 through node 1182. Also, source 1184 of the transistor 1120 is electrically connected to drain 1185 of the transistor 1116. Both input 1187 of the inverter 1128 and gate 1188 of the transistor 1120 are applied with the same signal, namely PD. Output 1190 of the inverter 1128 is electrically connected to both drain 1192 and source 1194 of the transistor 1136, as well as to gate 1196 of the transistor 1116.

The operation of the clamp 1104 is similar to the operation of the clamp 504 shown in FIG. 4; however, the clamp 1104 includes additional transistors 1132 and 1136 configured as capacitor-plugged devices. The transistor 1132 functions as a capacitor and acts to pump additional charge into the node 1144 during off-switching of the transistor 104. The transistor 1136 also acts as a capacitor, and functions to sink additional charge from the node 1182 during off-switching of the transistor 108. It will be understood that the transistors 1132 and 1136 need not be non-standard as the voltage drop across their plates should not get smaller than the threshold voltage of the transistor.

Figure 12:
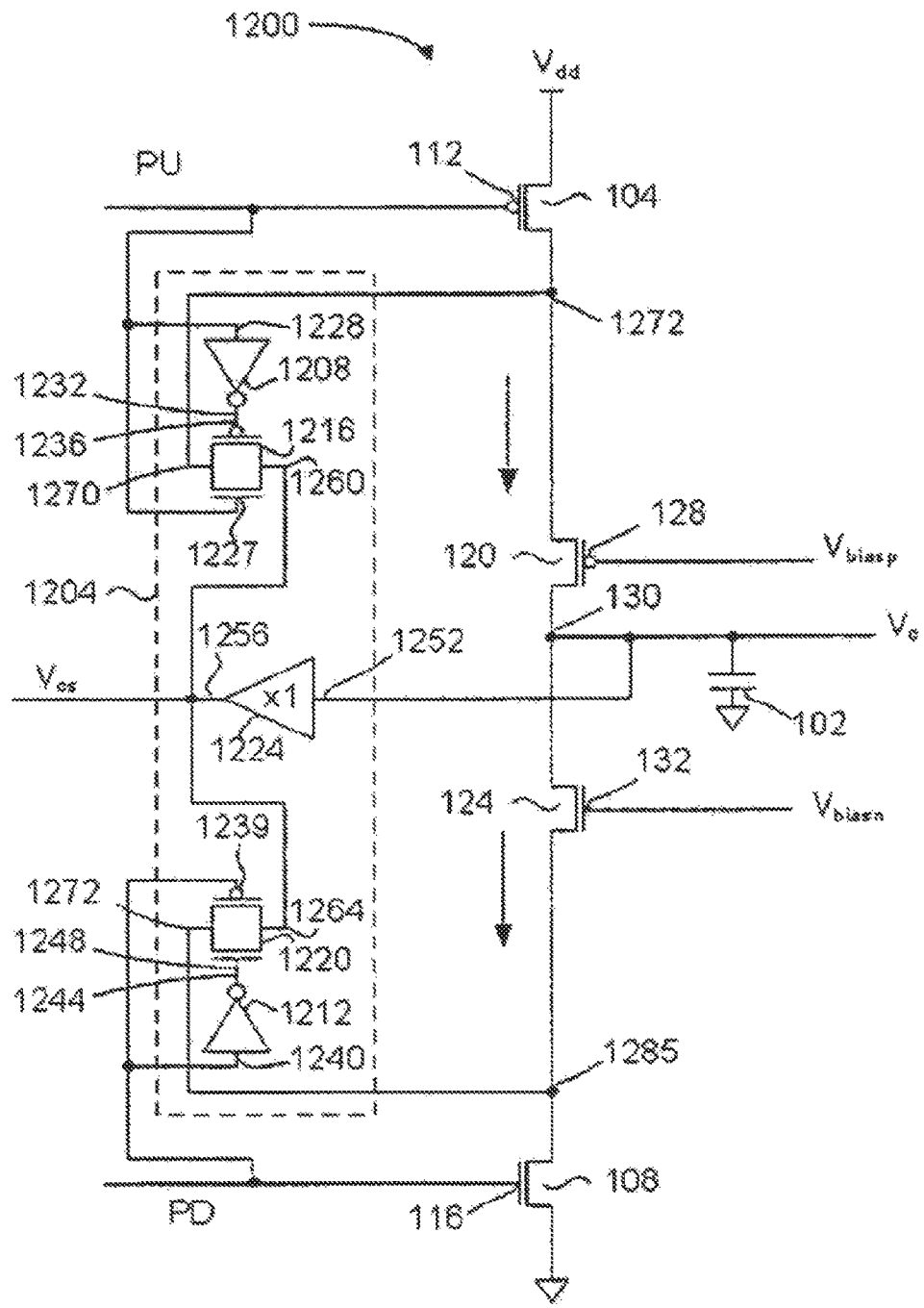
FIG. 12 is a circuit schematic representation of another charge pump that includes a clamp in accordance with a ninth example embodiment.

Reference will now be made to FIG. 12. FIG. 12 is a circuit schematic representation of another charge pump 1200 that includes a clamp 1204 in accordance with yet another alternative example embodiment. It will be seen that the charge pump 1200 is similar in certain respects to other charge pumps previously illustrated and described. For example, like a number of other clamps illustrated and described herein, the clamp 1204 does not force Vc to be constricted to a range within the limits defined by Vbiasp and Vbiasn.

The illustrated clamp 1204 comprises two inverters 1208 and 1212, two transmission gates 1216 and 1220, and an analogue repeater 1224. In terms of circuit configuration, the signal PU is received by both control input 1227 of the transmission gate 1216 and input 1228 of the inverter 1208 and output 1232 of the inverter 1208 is applied to control input 1236 of the transmission gate 1216. Likewise, the signal PD is received by both control input 1239 of the transmission gate 1220 and input 1240 of the inverter 1212, and output 1244 of the inverter 1212 is applied to control input 1248 of the transmission gate 1220. Also, input 1252 of the repeater 1224 is connected to the node 130, whereas output 1256 of the repeater 1224 is electrically connected to inputs 1260 and 1264 of the transmission gates 1216 and 1220 respectively.

Within the illustrated clamp 1204, the transmission gate 1216 is in operative communication with the switching transistor 104. In particular, output 1270 of the transmission gate 1216 is electrically connected to the switching transistor 104 through node 1272. Additionally, the transmission gate 1220 is in operative communication with the switching transistor 108. In particular, output 1272 of the transmission gate 1220 is electrically connected to the switching transistor 108 through node 1285.

During off-switching of the transistor 104, the transmission gate 1216 starts conducting, and thus the node 1272 will be coupled to the node at the output 1256 of the repeater 1224 (Vcs node). Leakage current is minimized because the voltage drop across the leakage current path is small and the voltage at the node 1272 is prevented from significantly falling in value while the transistor 104 is switched off. Also, the off-switching generated, parasitic current spike will only partially travel through the path between the switching transistor 104 and the capacitor 102 (an additional current path through the node 1272 is provided when the transmission gate 1216 is conducting).

Similarly, during off-switching of the transistor 108, the transmission gate 1220 starts conducting causing the node 1285 to be coupled to the Vcs node. Because replica voltage Vcs will be very close to voltage Vc which is being replicated, the node 1285 (or alternatively the node 1272) is coupled to a node having a voltage value close to Vc when the switching transistor is switched off. Thus, the voltage drop across the leakage path will be small enough for leakage to be minimized. Again, the off-switching generated, parasitic current spike (source portion of circuit) will only partially travel through the path between the switching transistor 108 and the capacitor 102 (an additional current path through the node 1285 is provided when the transmission gate 1220 is conducting).

Figure 13:
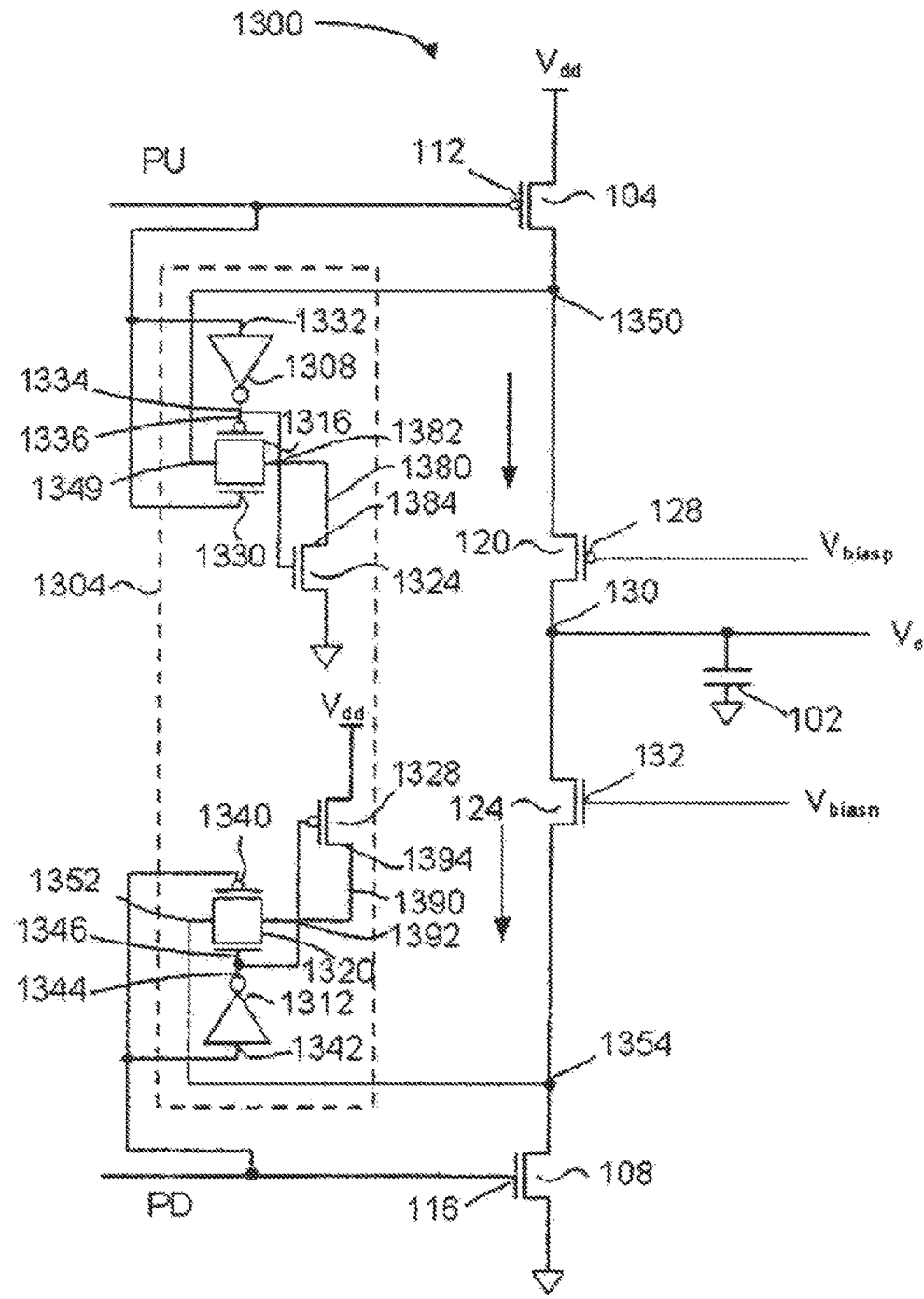
FIG. 13 is a circuit schematic representation of another charge pump that includes a clamp in accordance with a tenth example embodiment.

Reference will now be made to FIG. 13. FIG. 13 is a circuit schematic representation of another charge pump 1300 that includes a clamp 1304 in accordance with yet another alternative example embodiment. It will be seen that the charge pump 1300 is similar in certain respects to other charge pumps previously illustrated and described. For example, like a number of other clamps illustrated and described herein, the clamp 1304 does not force Vc to be constricted to a range within the limits defined by Vbiasp and Vbiasn.

The illustrated clamp 1304 comprises two inverters 1308 and 1312, two transmission gates 1316 and 1320, and two transistors 1324 and 1328. In terms of circuit configuration, the signal PU is received by both control input 1330 of the transmission gate 1316 and input 1332 of the inverter 1308, and output 1334 of the inverter 1308 is applied to control input 1336 of the transmission gate 1316. Likewise, the signal PD is received by both control input 1340 of the transmission gate 1320 and input 1342 of the inverter 1312, and output 1344 of the inverter 1312 is applied to control input 1346 of the transmission gate 1320.

Within the illustrated clamp 1304, the transmission gate 1316 is in operative communication with the switching transistor 104. In particular, output 1349 of the transmission gate 1316 is electrically connected to the switching transistor 104 through node 1350, and an open path between the node 1350 and ground exists when the NMOS transistor 1324 is on and the transistor gate 1316 is conducting. Additionally, the transmission gate 1320 is in operative communication with the switching transistor 108. In particular, output 1352 of the transmission gate 1320 is electrically connected to the switching transistor 108 through node 1354, and an open path between the node 1354 and Vdd exists when the PMOS transistor 1328 is turned on and the transmission gate 1320 is conducting.

During off-switching of the transistor 104, the transmission gate 1316 starts conducting, and thus the node 1350 will be coupled to node 1380 located between input 1382 of the transmission gate 1316 and drain 1384 of the transistor 1324. At the time of off-switching, the node 1380 will be at about ground potential, and charge exchange between the nodes 1380 and 1350 will occur during which voltage at the node 1350 will drop off sharply cutting off tail out current, and also during this time of charge exchange, an additional current path through the node 1350 is provided, in order that the parasitic current spike will only partially travel through the path between the switching transistor 104 and the capacitor 102. The new voltage value to which voltage at the node 1350 transitions is maintained while the switching transistor 104 is switched off, in order that leakage current flow is minimized during this passive phase. Also, the transistor 1324 will be turned off so that the leakage path will be broken.

Similarly, during off-switching of the transistor 108, the transmission gate 1320 starts conducting, and thus the node 1354 will be coupled to node 1390 located between input 1392 of the transmission gate 1320 and drain 1394 of the transistor 1328. At the time of off-switching, the node 1390 will be at about Vdd, and charge exchange between the nodes 1390 and 1354 will occur during which voltage at the node 1354 will rise sharply cutting off tail out current, and also during this time of charge exchange, an additional current path through the node 1354 is provided, in order that the parasitic current spike will only partially travel through the path between the switching transistor 108 and the capacitor 102. The new voltage value to which voltage at the node 1354 transitions is maintained while the switching transistor 108 is switched off, in order that leakage current flow is minimized during this passive phase. Also, the transistor 1328 will be turned off so that the leakage path will be broken.

Figure 14:
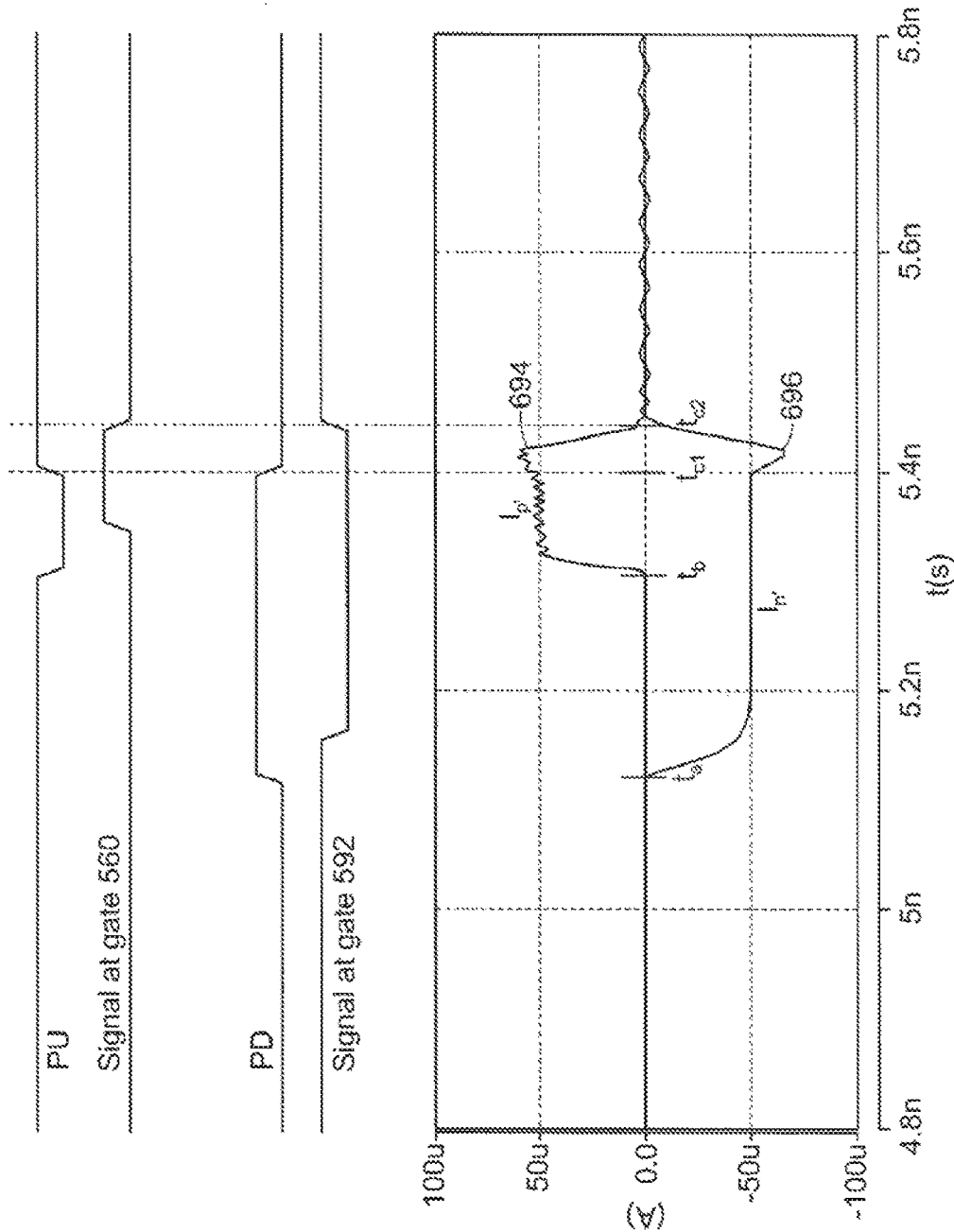
FIG. 14 shows diagrammatic graphs illustrating signals applied to gates of transistors of the clamp shown in FIG. 4, and another example waveform graph also being shown, the waveform graph illustrating currents through particular portions of the circuit of FIG. 4 over time.

Reference will now be made to FIG. 14. Like FIG. 2, an example waveform graph of currents (over time) is shown in FIG. 14; however for currents through circuit paths shown in FIG. 4 (as opposed to circuit paths shown in FIG. 1). Example signals PU and PD (and derived signals at the gates 560 and 592) are also shown in diagrammatic graphs above the example waveform graph.

With reference now to FIGS. 4 and 14, it will be observed for a period of time beginning at time tc1 (corresponding to the start of off-switching of the transistor 108) and ending at time tc2, a value of logic low (which produces the on state when applied to the gate of a PMOS transistor) will be applied to both the gates of the transistors 516 and 520. Thus, for a brief period of time, the pair of transistors 516 and 520 will provide an additional path for off30 switching current from the transistor 108; however, it will be understood that at other times at least one of the transistors 516 and 520 will be turned off, and therefore the additional path will not be provided at such times. With respect to the source portion transistor pair of the clamp 504 (i.e. the transistors 508 and 512) they work in a similar manner; however, as will be appreciated by those skilled in the art, it is a value of logic high (rather than logic low) that produces the on state when applied to the gate of an NMOS transistor.

Comparing now plots of current Ip and In in FIG. 2 to plots of current Ip' and In' in FIG. 14, the effects of the clamp 504 are evident. In particular, it will be seen that there is only a significantly smaller upward spike 694 in the current Ip' as the switching transistor 104 is switched off. Likewise, there is only a significantly smaller downward spike 696 at time tc2 as the switching transistor 108 is switched off. It also evident from the waveform graph that the clamp 504 effects a sharp cut off of tail out currents, as the currents Ip' and In' quickly fall to about 0 µA after time tc1. Simulation results for the clamps shown in FIGS. 5 to 13 are similar (significantly smaller current spikes, sharp cut off of tail out currents).

Figure 15:
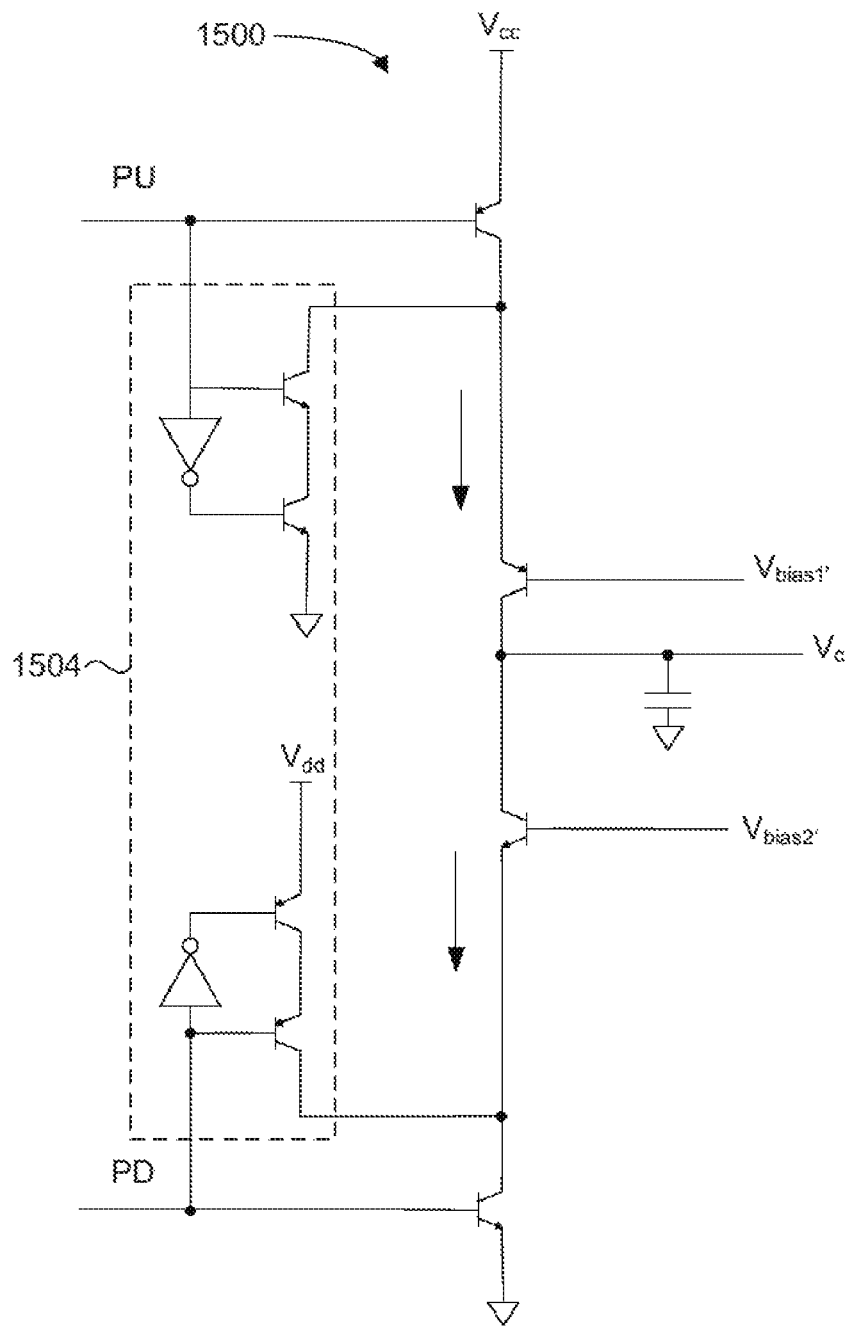
FIG. 15 is a circuit schematic representation of another charge pump conceptually similar to the charge pump of FIG. 4, but comprised of bipolar transistors instead of FETs.
Figure 16:
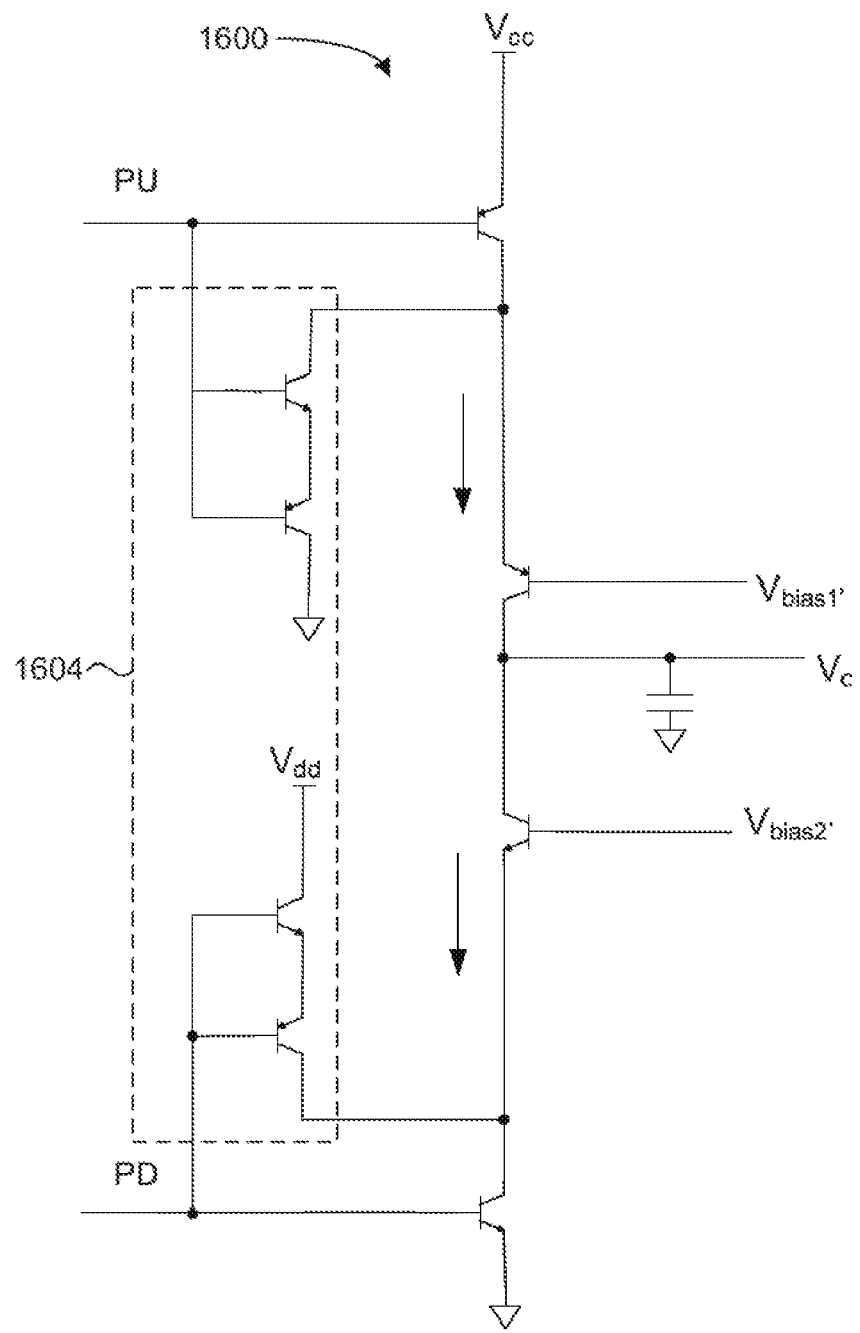
FIG. 16 is a circuit schematic representation of another charge pump conceptually similar to the charge pump of FIG. 5, but comprised of bipolar transistors instead of FETs.

Although the charge pumps shown in the accompanying drawings have both a source portion and a sink portion, it will be understood that, in some examples, a charge pump may only have a source portion or a sink portion. Also, although the transistors within the circuits of the illustrated example embodiments are FETs, it will be understood that the teachings contained herein provide instruction for the implementation of charge pumps with clamps comprised of other types of transistors, such as bipolar transistors, for example. Referring to FIGS. 15 and 16, there are circuit schematic representations of example charge pumps 1500 and 1600 that includes clamps 1504 and 1604 respectively. The charge pumps 1500 and 1600 are conceptually similar to the charge pumps of FIGS. 4 and 5 respectively, but are comprised of bipolar transistors instead of FETs.

Certain adaptations and modifications of the described embodiments can be made. Therefore, the above discussed embodiments are considered to be illustrative and not restrictive.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

The invention claimed is:

1. A charge pump comprising:
   a first capacitor coupled to an output of the charge pump;
   a pump up current path comprising a first transistor coupled between a first power supply and a first node, the gate of the first transistor coupled to a first output of said phase detector, and a second transistor coupled between the first node and said first capacitor, the gate of the second transistor coupled to a first bias input;
   a pump down current path comprising a third transistor coupled between a second power supply and a second node, the gate of the third transistor coupled to a second output of said phase detector, and a fourth transistor coupled between the second node and the first capacitor, the gate of the fourth transistor coupled to a second bias input;
   a first alternate current path coupled between the first intermediate node and said second power supply configured to conduct current for a first period of time when said first transistor is switched to an off state; and
   a second alternate current path coupled between the second intermediate node and said first power supply configured to conduct current for a second period of time when said third transistor is switched to an off state,
   wherein said first alternate current path further comprises a fifth transistor coupled to the first node and a third node, a sixth transistor coupled to the third node and the second power supply, and a first inverter whose input is coupled to the first output of the phase detector and whose output is coupled to the gate of the fifth transistor, the gate of the sixth transistor coupled to a third bias input,
   wherein said second alternate current path further comprises a seventh transistor coupled to the second node and a fourth node, an eighth transistor coupled to the fourth node and said first power supply, and a second inverter whose input is coupled to the second output of the phase detector and whose output is coupled to the seventh transistor, the gate of the eighth transistor coupled to a fourth bias input.

2. The charge pump of claim 1, wherein the first alternate path comprises a PMOS transistor.

3. The charge pump of claim 1, wherein the second alternate current path comprises a NMOS transistor.

4. The charge pump of claim 1, wherein the first alternate current path comprises an inverter and a PMOS transistor driven by the inverter.

5. The charge pump of claim 1, wherein the second alternate current path comprises an inverter and a NMOS transistor driven by the inverter.

6. The charge pump of claim 1, wherein the fifth transistor and the sixth transistor are each directly connected to the third node.

7. The charge pump of claim 1, wherein the seventh transistor and the eighth transistor are each directly connected to the first node.

8. The charge pump of claim 1, wherein the gate of the second transistor is directly connected to the first bias input.

9. The charge pump of claim 1, wherein the gate of the fourth transistor is directly connected to the second bias input.

* * * * *